United States Patent
Hirose et al.

(10) Patent No.: US 8,946,092 B2
(45) Date of Patent: Feb. 3, 2015

(54) METHOD OF MANUFACTURING SEMICONDUCTOR DEVICE, METHOD OF PROCESSING SUBSTRATE AND SUBSTRATE PROCESSING APPARATUS

(71) Applicant: Hitachi Kokusai Electric Inc., Tokyo (JP)

(72) Inventors: Yoshiro Hirose, Toyoma (JP); Yushin Takasawa, Toyama (JP); Tsukasa Kamakura, Toyama (JP); Yoshinobu Nakamura, Toyama (JP); Ryota Sasajima, Toyama (JP)

(73) Assignee: Hitachi Kokusai Electric Inc., Tokyo (JP)

( * ) Notice: Subject to any disclaimer, the term of this patent is extended or adjusted under 35 U.S.C. 154(b) by 0 days.

(21) Appl. No.: 14/036,568

(22) Filed: Sep. 25, 2013

(65) Prior Publication Data

US 2014/0024225 A1    Jan. 23, 2014

Related U.S. Application Data

(62) Division of application No. 13/083,022, filed on Apr. 8, 2011, now Pat. No. 8,546,272.

(30) Foreign Application Priority Data

Apr. 12, 2010 (JP) .................. 2010-091327
Dec. 16, 2010 (JP) .................. 2010-280421

(51) Int. Cl.
*H01L 21/02* (2006.01)
*C23C 16/30* (2006.01)
*C23C 16/455* (2006.01)
*H01L 21/67* (2006.01)

(52) U.S. Cl.
CPC ........... *H01L 21/0223* (2013.01); *C23C 16/30* (2013.01); *C23C 16/45531* (2013.01); *C23C 16/45546* (2013.01); *H01L 21/02126* (2013.01); *H01L 21/02178* (2013.01); *H01L 21/02181* (2013.01); *H01L 21/02186* (2013.01); *H01L 21/02189* (2013.01); *H01L 21/0228* (2013.01); *H01L 21/02104* (2013.01); *H01L 21/02247* (2013.01); *H01L 21/67011* (2013.01)
USPC ........................................ 438/770

(58) Field of Classification Search
None
See application file for complete search history.

(56) References Cited

U.S. PATENT DOCUMENTS

| | | | |
|---|---|---|---|
| 7,125,812 B2 | 10/2006 | Kumagai | |
| 2005/0095770 A1* | 5/2005 | Kumagai et al. | 438/202 |
| 2008/0213479 A1 | 9/2008 | Chou et al. | |

(Continued)

FOREIGN PATENT DOCUMENTS

| | | |
|---|---|---|
| CN | 1831191 A | 9/2006 |
| CN | 101192534 A | 6/2008 |

(Continued)

*Primary Examiner* — Charles Garber
*Assistant Examiner* — Stanetta Isaac
(74) *Attorney, Agent, or Firm* — Volpe and Koenig, P.C.

(57) ABSTRACT

An insulating film having features such as a low dielectric constant, a low etching rate and a high insulating property is formed. An oxycarbonitride film is formed on a substrate by performing a cycle a predetermined number of times, the cycle including: (a) supplying a gas containing an element to the substrate; (b) supplying a carbon-containing gas to the substrate; (c) supplying a nitrogen-containing gas to the substrate; and (d) supplying an oxygen-containing gas to the substrate.

19 Claims, 6 Drawing Sheets

(56) References Cited

U.S. PATENT DOCUMENTS

| | | | |
|---|---|---|---|
| 2010/0130024 A1 | 5/2010 | Takasawa et al. | |
| 2013/0017685 A1 | 1/2013 | Akae et al. | |

FOREIGN PATENT DOCUMENTS

| | | |
|---|---|---|
| JP | 2005-268699 A | 9/2005 |
| JP | 2008-227460 A | 9/2008 |
| JP | 2010010497 A | 1/2010 |
| JP | 2010-153795 A | 7/2010 |
| KR | 10-2004-0081424 | 9/2004 |
| KR | 10-2004-0081424 A | 9/2004 |
| KR | 10-2006-0015708 | 2/2006 |
| TW | 200721277 A | 6/2007 |
| WO | 03060978 | 7/2003 |
| WO | 2009/149167 A2 | 12/2009 |

\* cited by examiner

METHOD OF MANUFACTURING SEMICONDUCTOR DEVICE, METHOD OF PROCESSING SUBSTRATE AND SUBSTRATE PROCESSING APPARATUS

CROSS-REFERENCE TO RELATED PATENT APPLICATION

This application claims priority to and the benefit of Japanese Patent Applications No. 2010-091327 filed on Apr. 12, 2010 and No. 2010-280421 filed on Dec. 16, 2010, and is a divisional application of U.S. patent application Ser. No. 13/083,022 filed on Apr. 8, 2011, the entire contents of which are hereby incorporated by reference.

FIELD OF THE INVENTION

The present invention relates to a method of manufacturing a semiconductor device including a process of forming a thin film on a substrate, a method of processing a substrate, and a substrate processing apparatus.

DESCRIPTION OF THE RELATED ART

Processes of manufacturing a semiconductor device includes a process of forming an insulating film such as a silicon oxide ($SiO_2$) film or a silicon nitride ($Si_3N_4$) film on a wafer such as a silicon wafer. The $SiO_2$ film is widely used as an insulating film or an interlayer film due to its excellent insulating property and low dielectric property. Also, the $Si_3N_4$ film is widely used as an insulating film, a mask film, a charge accumulating film, or a stress control film due to its excellent insulating property, corrosion-resistant property, dielectric property, and film stress controlling property, etc. Technology of adding carbon (C) to these insulating films is also well known in the art (for example, see Patent Document 1). The etching-resistant property of the insulating films may be enhanced by such technology.

PRIOR-ART DOCUMENTS

Patent Documents

1. Japanese Patent Laid-Open Publication No. 2005-268699

However, when C is added to an insulating film, an etching-resistant property of the insulating film is enhanced, but a dielectric constant is increased and a leak-resistant property is deteriorated. That is, since each conventional insulating film has both advantages and disadvantages, there has been no film having all features of a low dielectric constant, a low etching rate and a high insulating property.

SUMMARY OF THE INVENTION

Therefore, it is an object of the present invention to provide a method of manufacturing a semiconductor device, a method of processing a substrate, and a substrate processing apparatus that are capable of forming an insulating film having features such as a low dielectric constant, a low etching rate, and a high insulating property.

According to one aspect of the present invention, there is provided a method of manufacturing a semiconductor device, the method including forming a oxycarbonitride film on a substrate by performing a cycle a predetermined number of times, the cycle including: (a) supplying a gas containing an element to the substrate; (b) supplying a carbon-containing gas to the substrate; (c) supplying a nitrogen-containing gas to the substrate; and (d) supplying an oxygen-containing gas to the substrate.

According to another aspect of the present invention, there is provided a method of processing a substrate, the method including forming an oxycarbonitride film on a substrate by performing a cycle a predetermined number of times, the cycle including: (a) supplying a gas containing an element to the substrate; (b) supplying a carbon-containing gas to the substrate; (c) supplying a nitrogen-containing gas to the substrate; and (d) supplying an oxygen-containing gas to the substrate.

According to still another aspect of the present invention, there is provided a substrate processing apparatus including:

a process vessel configured to accommodate a substrate;

an element-containing gas supply system configured to supply a gas containing an element into the process vessel;

a carbon-containing gas supply system configured to supply a carbon-containing gas into the process vessel;

a nitrogen-containing gas supply system configured to supply a nitrogen-containing gas into the process vessel;

an oxygen-containing gas supply system configured to supply an oxygen-containing gas into the process vessel; and a control unit configured to the control element-containing gas supply system, the carbon-containing gas supply system, the nitrogen-containing gas supply system and the oxygen-containing gas supply system to form an oxycarbonitride film on the substrate by performing a cycle a predetermined number of times, the cycle including: supplying the gas containing the element to the substrate in the process vessel; supplying the carbon-containing gas to the substrate in the process vessel; supplying the nitrogen-containing gas to the substrate in the process vessel; and supplying the oxygen-containing gas to the substrate in the process vessel.

DETAILED DESCRIPTION OF THE PREFERRED EMBODIMENTS

Hereinafter, exemplary embodiments of the present invention will be described with reference to the accompanying drawings.

(1) Configuration of Substrate Processing Apparatus

Figure 1:
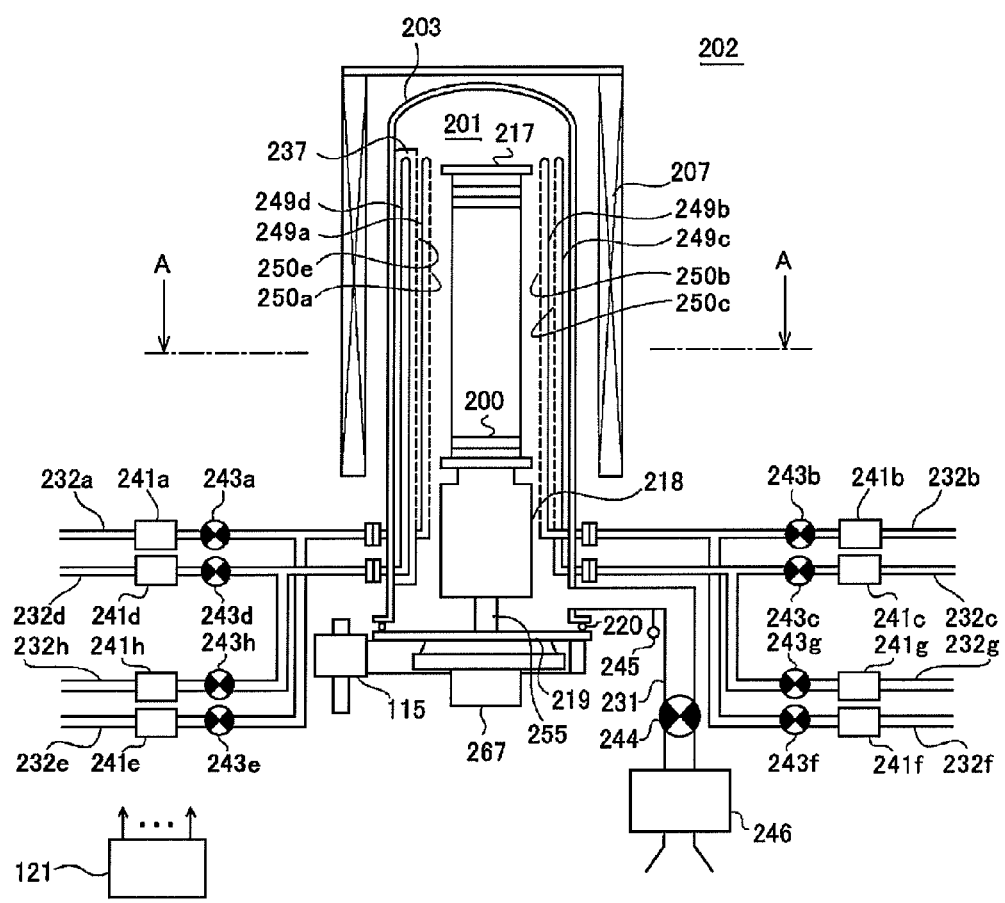
FIG. 1 is a configuration diagram schematically illustrating a vertical process furnace of a substrate processing apparatus preferably used in an exemplary embodiment of the present invention, illustrating a longitudinal cross section of the process furnace.
Figure 2:
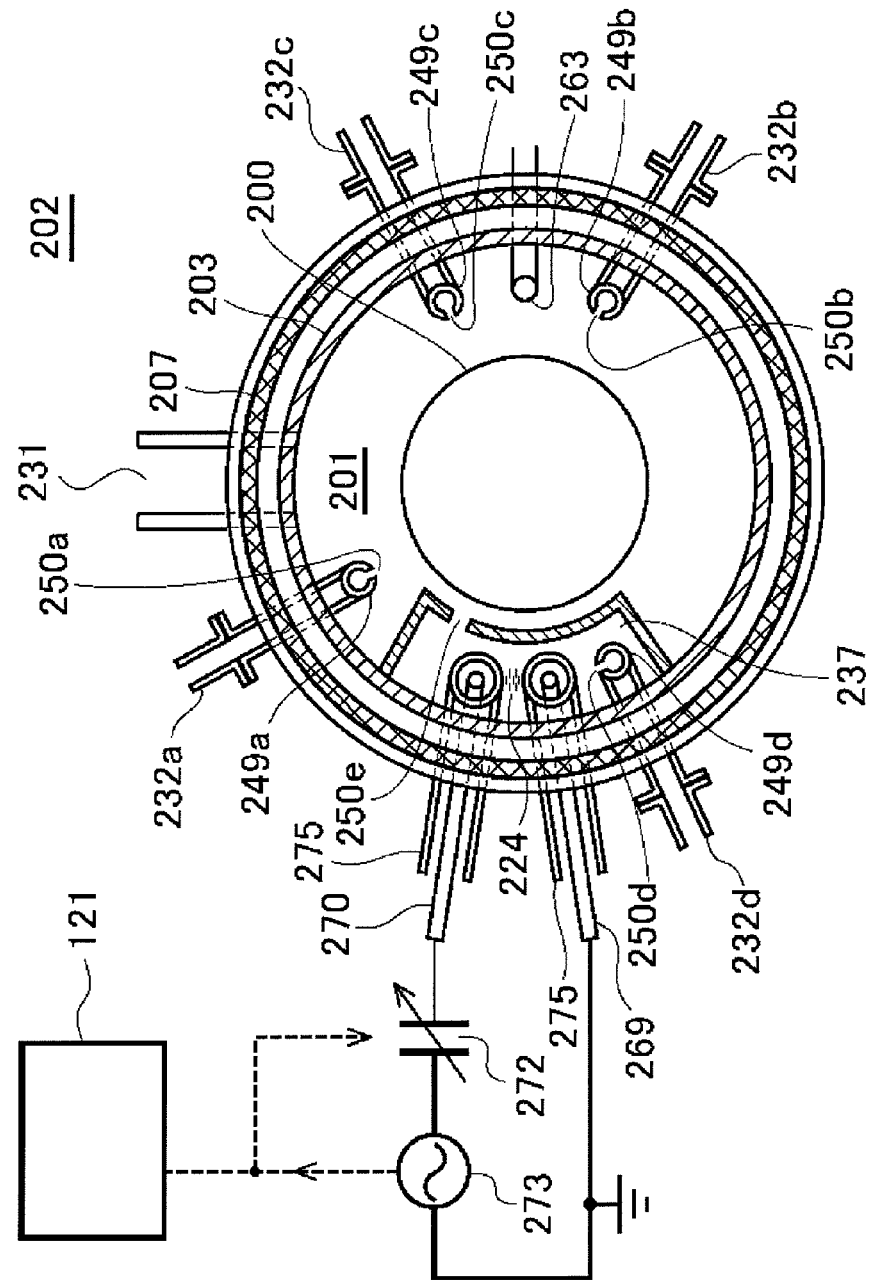
FIG. 2 is a configuration diagram schematically illustrating the vertical process furnace of the substrate processing apparatus preferably used in the exemplary embodiment of the present invention, illustrating a cross section of the process furnace taken along line A-A of FIG. 1.

FIG. 1 is a configuration diagram schematically illustrating a vertical process furnace of a substrate processing apparatus preferably used in an exemplary embodiment of the present invention, illustrating a longitudinal cross section of the process furnace 202. FIG. 2 is a configuration diagram schematically illustrating the vertical process furnace of the substrate processing apparatus preferably used in the exemplary embodiment of the present invention, illustrating a cross section of the process furnace 202 taken along line A-A of FIG. 1.

As shown in FIG. 1, the process furnace 202 includes a heater 207 serving as a heating means (a heating device). The heater 207 has a cylindrical shape and is supported by a heater base (not shown) serving as a holding plate to be installed vertically. As will be described below, the heater 207 also functions as an activation device configured to activate gas by heat.

A reaction tube 203 having a shape concentric with the heater 207 and constituting a reaction vessel (a process vessel) is installed inside the heater 207. The reaction tube 203 is, for example, made of a heat-resistant material such as quartz ($SiO_2$) or silicon carbide (SiC). The reaction tube 203 has a cylindrical shape with its upper end closed and lower end open. A process chamber 201 is formed in a hollow cylindrical portion of the reaction tube 203. The process chamber 201 is configured to accommodate wafers 200 serving as substrates in a horizontal posture in a state where the wafers 200 are vertically arranged in multiple stages by a boat 217 to be described below.

A first nozzle 249a, a second nozzle 249b, a third nozzle 249c, and a fourth nozzle 249d are installed inside the process chamber 201 so as to pass through a lower portion of the reaction tube 203. A first gas supply pipe 232a, a second gas supply pipe 232b, a third gas supply pipe 232c, and a fourth gas supply pipe 232d are connected to the first nozzle 249a, the second nozzle 249b, the third nozzle 249c, and the fourth nozzle 249d, respectively. In this way, the four nozzles 249a, 249b, 249c, and 249d and the four gas supply pipes 232a, 232b, 232c, and 232d are installed in the reaction tube 203 so that many kinds of gases, for example, four kinds of gases here, may be supplied into the process chamber 201.

A mass flow controller (MFC) 241a, which is a flow rate controller (a flow rate control unit), and a valve 243a, which is an opening/closing valve, are installed in the first gas supply pipe 232a in order from an upstream side thereof. A first inert gas supply pipe 232e is connected to a downstream side of the valve 243a of the first gas supply pipe 232a. An MFC 241e, which is a flow rate controller (a flow rate control unit), and a valve 243e, which is an opening/closing valve, are installed in the first inert gas supply pipe 232e in order from an upstream side thereof. The above-described first nozzle 249a is connected to a tip end portion of the first gas supply pipe 232a. The first nozzle 249a is vertically installed in an arc-shaped space between an inner wall of the reaction tube 203 and the wafers 200 in a stacking direction of the wafers 200 along an upper portion from a lower portion of the inner wall of the reaction tube 203. The first nozzle 249a is formed as an L-shaped long nozzle. A gas supply hole 250a configured to supply a gas is installed on a side surface of the first nozzle 249a. The gas supply hole 250a is opened toward the center of the reaction tube 203. A plurality of gas supply holes 250a are installed from a lower portion to an upper portion of the reaction tube 203 to have the same opening area and the same opening pitch. A first gas supply system mainly includes the first gas supply pipe 232a, the MFC 241a, the valve 243a, and the first nozzle 249a. A first inert gas supply system mainly includes the first inert gas supply pipe 232e, the MFC 241e, and the valve 243e.

An MFC 241b, which is a flow rate controller (a flow rate control unit), and a valve 243b, which is an opening/closing valve, are installed in the second gas supply pipe 232b in order from an upstream side thereof. A second inert gas supply pipe 232f is connected to a downstream side of the valve 243b of the second gas supply pipe 232b. An MFC 241f, which is a flow rate controller (a flow rate control unit), and a valve 243f, which is an opening/closing valve, are installed in the second inert gas supply pipe 232f in order from an upstream side thereof. The above-described second nozzle 249b is connected to a tip end portion of the second gas supply pipe 232b. The second nozzle 249b is vertically installed in an arc-shaped space between an inner wall of the reaction tube 203 and the wafers 200 in a stacking direction of the wafers 200 along an upper portion from a lower portion of the inner wall of the reaction tube 203. The second nozzle 249b is formed as an L-shaped long nozzle. A gas supply hole 250b configured to supply a gas is installed on a side surface of the second nozzle 249b. The gas supply hole 250b is opened toward the center of the reaction tube 203. A plurality of gas supply holes 250b are installed from a lower portion to an upper portion of the reaction tube 203 to have the same opening area and the same opening pitch. A second gas supply system mainly includes the second gas supply pipe 232b, the MFC 241b, the valve 243b, and the second nozzle 249b. Also, a second inert gas supply system mainly includes the second inert gas supply pipe 232f, the MFC 241f, and the valve 243f.

An MFC 241c, which is a flow rate controller (a flow rate control unit), and a valve 243c, which is an opening/closing valve, are installed in the third gas supply pipe 232c in order from an upstream side thereof. A third inert gas supply pipe 232g is connected to a downstream side of the valve 243c of the third gas supply pipe 232c. An MFC 241g, which is a flow rate controller (a flow rate control unit), and a valve 243g, which is an opening/closing valve, are installed in the third inert gas supply pipe 232g in order from an upstream side thereof. The above-described third nozzle 249c is connected to a tip end portion of the third gas supply pipe 232c. The third nozzle 249c is vertically installed in an arc-shaped space between an inner wall of the reaction tube 203 and the wafers 200 in a stacking direction of the wafers 200 along an upper portion from a lower portion of the inner wall of the reaction tube 203. The third nozzle 249c is formed as an L-shaped long nozzle. A gas supply hole 250c configured to supply a gas is installed on a side surface of the third nozzle 249c. The gas supply hole 250c is opened toward the center of the reaction tube 203. A plurality of gas supply holes 250c are installed from a lower portion to an upper portion of the reaction tube 203 to have the same opening area and the same opening pitch. A third gas supply system mainly includes the third gas supply pipe 232c, the MFC 241c, the valve 243c, and the third nozzle 249c. Also, a third inert gas supply system mainly includes the third inert gas supply pipe 232g, the MFC 241g, and the valve 243g.

An MFC 241d, which is a flow rate controller (a flow rate control unit), and a valve 243d, which is an opening/closing valve, are installed in the fourth gas supply pipe 232d in order from an upstream side thereof. A fourth inert gas supply pipe 232h is connected to a downstream side of the valve 243d of the fourth gas supply pipe 232d. An MFC 241h, which is a flow rate controller (a flow rate control unit), and a valve 243h, which is an opening/closing valve, are installed in the fourth inert gas supply pipe 232h in order from an upstream side thereof. The above-described fourth nozzle 249d is connected to a tip end portion of the fourth gas supply pipe 232d. The fourth nozzle 249d is installed inside a buffer chamber 237, which is a gas dispersing space.

The buffer chamber 237 is installed in an arc-shaped space between an inner wall of the reaction tube 203 and the wafers 200 in a stacking direction of the wafers 200 from a lower portion to an upper portion of the inner wall of the reaction tube 203. A gas supply hole 250e configured to supply a gas is installed on an end portion of a wall of the buffer chamber 237, which is adjacent to the wafers 200. The gas supply hole 250e is opened toward the center of the reaction tube 203. A plurality of gas supply holes 250e are installed from a lower portion to an upper portion of the reaction tube 203 to have the same opening area and the same opening pitch.

The fourth nozzle 249d is vertically installed at an end portion opposite to another end portion of the buffer chamber 237 in which the gas supply holes 250e are installed, in a stacking direction of the wafers 200 along an upper portion from a lower portion of the inner wall of the reaction tube 203. The fourth nozzle 249d is formed as an L-shaped long nozzle. A gas supply hole 250d configured to supply a gas is installed on a side surface of the fourth nozzle 249d. The gas supply hole 250d is opened toward the center of the buffer chamber 237. Like the gas supply holes 250e of the buffer chamber 237, a plurality of gas supply holes 250d are installed from a lower portion to an upper portion of the reaction tube 203. When a difference in pressure between the interior of the buffer chamber 237 and the interior of the process chamber 201 is small, the plurality of gas supply holes 250d may have the same opening area and the same opening pitch from an upstream side (a lower portion) to a downstream side (an upper portion). However, when the difference in pressure is large, each opening area may become larger or each opening pitch may become smaller as the opening area or the opening pitch span from an upstream side toward a downstream side.

In the embodiment of the present invention, gases are injected at different flow velocities but at substantially the same flow rate through the gas supply holes 250d of the fourth nozzle 249d by adjusting the opening areas or opening pitches of the gas supply holes 250d from an upstream side to a downstream side of the fourth nozzle 249d as described above. Then, the gas injected through each of the gas supply holes 250d is first introduced into the buffer chamber 237, and the difference in the flow velocities of the gas in the buffer chamber 237 is uniformly adjusted.

That is, after the particle velocity of the gas injected into the buffer chamber 237 through the gas supply holes 250d of the fourth nozzle 249d is lowered in the buffer chamber 237, the gas is injected into the process chamber 201 through the gas supply holes 250e of the buffer chamber 237. Accordingly, the gas that has been injected into the buffer chamber 237 through each of the gas supply holes 250d of the fourth nozzle 249d has uniform flow rate and flow velocity when the gas is injected into the process chamber 201 through each of the gas supply holes 250e of the buffer chamber 237.

A fourth gas supply system mainly includes the fourth gas supply pipe 232d, the MFC 241d, the valve 243d, the fourth nozzle 249d, and the buffer chamber 237. Also, in the fourth gas supply system, the buffer chamber 237 functions as a nozzle configured to supply a gas toward the wafers 200. A fourth inert gas supply system mainly includes the fourth inert gas supply pipe 232h, the MFC 241h, and the valve 243h.

For example, a silicon (Si) source gas, i.e., a gas containing silicon (a silicon-containing gas), is supplied into the process chamber 201 through the first gas supply pipe 232a via the MFC 241a, the valve 243a, and the first nozzle 249a. Hexachlorodisilane ($Si_2Cl_6$, HCD) gas, for example, may be used as the silicon-containing gas. When a liquid material, such as HCD, which is in a liquid state at a normal temperature and under a normal pressure is used, the liquid material is vaporized by a vaporizing system such as a vaporizer or a bubbler to be supplied as a source gas.

For example, a gas containing carbon (C) (a carbon-containing gas) is supplied into the process chamber 201 through the second gas supply pipe 232b via the MFC 241b, the valve 243b, and the second nozzle 249b. Propylene ($C_3H_6$) gas, for example, may be used as the carbon-containing gas. Also, a gas containing hydrogen (H) (a hydrogen-containing gas) may be supplied into the process chamber 201 through the second gas supply pipe 232b via the MFC 241b, the valve 243b, and the second nozzle 249b. Hydrogen ($H_2$) gas, for example, may be used as the hydrogen-containing gas.

For example, a gas containing nitrogen (N) (a nitrogen-containing gas) is supplied into the process chamber 201 through the third gas supply pipe 232c via the MFC 241c, the valve 243c, and the third nozzle 249c. Ammonia ($NH_3$) gas, for example, may be used as the nitrogen-containing gas.

For example, a gas containing oxygen (O) (an oxygen-containing gas) is supplied into the process chamber 201 through the fourth gas supply pipe 232d via the MFC 241d, the valve 243d, the fourth nozzle 249d, and the buffer chamber 237. Oxygen ($O_2$) gas, for example, may be used as the oxygen-containing gas.

For example, $N_2$ gas is supplied into the process chamber 201 through the inert gas supply pipes 232e, 232f, 232g, and 232h via the MFCs 241e, 241f, 241g, and 241h, the valves 243e, 243f, 243g, and 243h, the gas supply pipes 232a, 232b, 232c, and 232d, the gas nozzles 249a, 249b, 249c, and 249d, and the buffer chamber 237.

For example, when the above-described gases flow through the gas supply pipes, the first gas supply system constitutes a source gas supply system, i.e., a silicon-containing gas supply system (a silane-based gas supply system). Also, the second gas supply system constitutes a carbon-containing gas supply system or a hydrogen-containing gas supply system. Also, the third gas supply system constitutes a nitrogen-containing gas supply system. In addition, the fourth gas supply system constitutes an oxygen-containing gas supply system. The source gas supply system is also simply referred to as a source supply system. When the carbon-containing gas, the hydrogen-containing gas, the nitrogen-containing gas, and the oxygen-containing gas are generally called reaction gases, the carbon-containing gas supply system, the hydrogen-containing gas supply system, the nitrogen-containing gas supply system, and the oxygen-containing gas supply system constitute a reaction gas supply system.

As shown in FIG. 2, a first rod-shaped electrode 269, i.e., a first electrode, and a second rod-shaped electrode 270, i.e., a second electrode, each of which has a thin and long structure, are installed inside the buffer chamber 237 along a stacking direction of the wafers 200 from a lower portion to an upper portion of the reaction tube 203. Each of the first rod-shaped electrode 269 and the second rod-shaped electrode 270 is installed in parallel to the fourth nozzle 249d. Each of the first rod-shaped electrode 269 and the second rod-shaped electrode 270 is covered and protected by an electrode protecting tube 275, which is a protection tube configured to protect the electrodes from upper portions to lower portions thereof. One of the first rod-shaped electrode 269 and the second rod-shaped electrode 270 is connected to a high-frequency power source 273 via a matching transformer 272, and the other is connected to a ground, which is a reference potential. As a result, plasma is produced in a plasma producing region 224 between the first rod-shaped electrode 269 and the second rod-shaped electrode 270. A plasma source serving as a plasma generator (a plasma generating unit) mainly includes the first rod-shaped electrode 269, the second rod-shaped electrode 270, the electrode protecting tubes 275, the matching transformer 272, and the high-frequency power source 273. As described below, the plasma source also functions as an activation device configured to activate gas by plasma.

The electrode protecting tube 275 is configured such that each of the first rod-shaped electrode 269 and the second rod-shaped electrode 270 can be inserted into the buffer chamber 237 in a state where first rod-shaped electrode 269 and the second rod-shaped electrode 270 are separated from an atmosphere of the buffer chamber 237. Here, when an interior of the electrode protecting tube 275 has the same atmosphere as an exterior air (atmosphere), the first rod-shaped electrode 269 and the second rod-shaped electrode 270 inserted respectively into the electrode protecting tubes 275 are oxidized by heat of the heater 207. Therefore, an inert gas purge mechanism charged or purged with an inert gas such as nitrogen, restrained to a sufficiently low oxygen concentration, and configured to prevent oxidation of the first rod-shaped electrode 269 or the second rod-shaped electrode 270 is installed in the interior of the electrode protecting tube 275.

An exhaust pipe 231 configured to exhaust an atmosphere in the process chamber 201 is installed in the reaction tube 203. A vacuum pump 246 serving as a vacuum exhaust unit is connected to the exhaust pipe 231 via a pressure sensor 245 serving as a pressure detector (a pressure detecting unit) configured to detect a pressure in the process chamber 201, and an auto pressure controller (APC) valve 244 serving as a pressure regulator (a pressure regulating unit). The vacuum pump 246 may vacuum-exhaust the process chamber 201 so that a pressure in the process chamber 201 becomes a predetermined pressure (vacuum degree). Also, the APC valve 244 is an opening/closing valve that may vacuum-exhaust an interior of the process chamber 201 or stop the vacuum-exhausting of an interior of the process chamber 201 as it is opened and closed and may regulate a pressure in the process chamber 201 according to an opening degree of the valve 244. An exhaust system mainly includes the exhaust pipe 231, the APC valve 244, the vacuum pump 246, and the pressure sensor 245.

A seal cap 219 serving as a furnace port cover configured to hermetically seal a lower end opening of the reaction tube 203 is installed on a lower portion of the reaction tube 203. The seal cap 219 is installed to vertically contact a lower end of the reaction tube 203 on the lower side of the reaction tube 203. For example, the seal cap 219 is made of a metal such as stainless steel and has a disk shape. An O-ring 220 serving as a seal member configured to contact the lower end of the reaction tube 203 is installed on an upper surface of the seal cap 219. A boat rotating mechanism 267 configured to rotate the boat 217 is installed at an opposite side of the process chamber 201 with respect to a center of the seal cap 219. A rotary shaft 255 of the boat rotating mechanism 267 passes through the seal cap 219 to be connected to the boat 217 to be described below. The wafers 200 are rotated by rotating the boat 217. The seal cap 219 is configured to be vertically elevated by a boat elevator 115 serving as an elevation mechanism vertically installed outside the reaction tube 203 so that the boat 217 can be loaded into the process chamber 201 or unloaded from the process chamber 201.

The boat 217 serving as a substrate supporting tool is made of a heat-resistant material, for example, $SiO_2$ or SiC. The boat 217 is configured to concentrically align a plurality of wafers 200 in a horizontal posture and support the plurality of wafers 200 in multiple stages. Also, an insulating member 218 made of a heat-resistant material such as $SiO_2$ or SiC is configured to be installed at a lower portion of the boat 217 so that heat from the heater 207 cannot be easily transferred to the seal cap 219. Also, the insulating member 218 may include a plurality of insulating plates made of a heat-resistant material such as $SiO_2$ or SiC, and an insulating plate holder configured to support the insulating plates in a horizontal posture in multiple stages.

A temperature sensor 263 serving as a temperature detector is installed inside the reaction tube 203. The process chamber 201 is configured to have a desired temperature distribution by regulating power supplied to the heater 207 based on temperature information detected by the temperature sensor 263. The temperature sensor 263 is L-shaped similar to the nozzles 249a, 249b, 249c, and 249c and is installed along the inner wall of the reaction tube 203.

A controller 121, which is a control unit (a control means), is connected to the MFCs 241a, 241b, 241c, 241d, 241e, 241f, 241g, and 241h, the valves 243a, 243b, 243c, 243d, 243e, 243f, 243g, and 243h, the pressure sensor 245, the APC valve 244, the vacuum pump 246, the heater 207, the temperature sensor 263, the boat rotating mechanism 267, the boat elevator 115, the high-frequency power source 273, the matching transformer 272, etc. The controller 121 controls flow rate regulating operations for various gases by the MFCs 241a, 241b, 241c, 241d, 241e, 241f, 241g, and 241h, opening/closing operations of the valves 243a, 243b, 243c, 243d, 243e, 243f, 243g, and 243h, opening/closing operations of the APC valve 244, a pressure regulating operation of the APC valve 244 based on the pressure sensor 245, a temperature regulating operation of the heater 207 based on the temperature sensor 263, starting and stopping of the vacuum pump 246, a rotating speed regulating operation of the boat rotating mechanism 267, an elevating operation of the boat elevator 115, etc., or controls power supply of the high-frequency power source 273 and an impedance of the matching transformer 272.

(2) Substrate Processing Process

Next, a sequence example of forming a silicon oxycarbonitride film (a SiOCN film) serving as an insulating film on a substrate will be described as a process of the processes of manufacturing a semiconductor device using the process furnace of the above-described substrate processing apparatus. In the following description, the operations of the units constituting the substrate processing apparatus are also controlled by the controller 121.

According to a conventional chemical vapor deposition (CVD) method, a plurality of gases containing a plurality of elements constituting a film to be formed are supplied together at the same time. According to a conventional atomic layer deposition (ALD) method, a plurality of gases containing a plurality of elements constituting a film to be formed are alternately supplied. Then, a $SiO_2$ film or a $Si_3N_4$ film is formed by controlling supply conditions such as a flow rate of a supplied gas, a gas supplying time, and a plasma power during the gas supply. For example, the supply conditions are controlled so that, in the case of forming the $SiO_2$ film by the technology, a composition ratio of the $SiO_2$ film becomes a stoichiometric composition ratio of O/Si≈2, and in the case of forming the $Si_3N_4$ film, a composition ratio of the $Si_3N_4$ film becomes a stoichiometric composition ratio of N/Si≈1.33.

According to the embodiment of the present invention, a supply condition is controlled so that a composition ratio of a film to be formed becomes a stoichiometric composition ratio or a predetermined composition ratio different from the stoichiometric composition ratio. For example, a supply condition is controlled such that at least one of a plurality of elements constituting a film to be formed becomes a more excessive than the other elements in terms of the stoichiometric composition ratio. Hereinafter, a sequence example of forming a film while controlling a ratio of the plurality of elements constituting a film to be formed, i.e., the composition ratio of the film to be formed, will be described.

(First Sequence)

Figure 3:
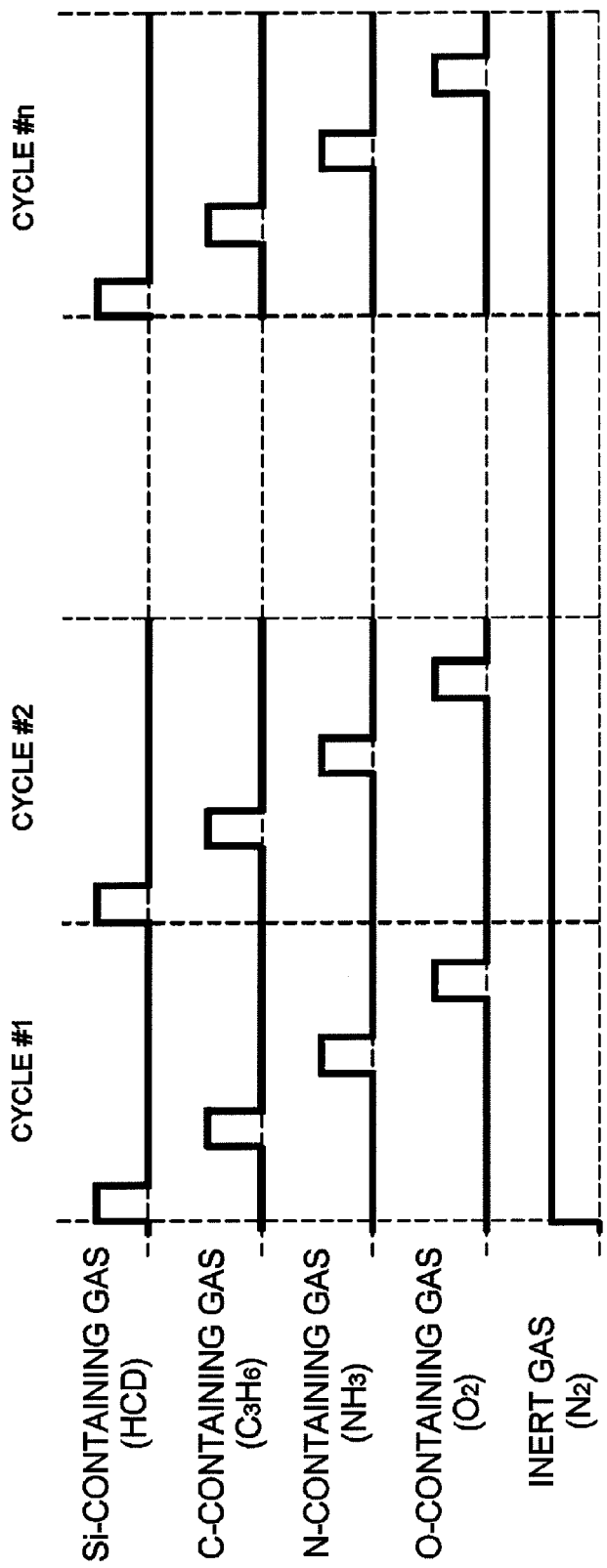
FIG. 3 is a diagram illustrating gas supply timings in a first sequence according to an embodiment of the present invention.

First, a first sequence according to an embodiment of the present invention will be described. FIG. 3 is a diagram illustrating gas supply timing in a first sequence according to the embodiment of the present invention.

In the first sequence according to the embodiment of the present invention, a SiOCN film having a predetermined thickness is formed on a wafer 200 by performing, a predetermined number of times (n times), a cycle including the steps of:

(a) supplying a silicon-containing gas into a process vessel accommodating the wafer 200 under a condition where a CVD reaction is caused to form a silicon-containing layer on the wafer 200;

(b) supplying a carbon-containing gas into the process vessel to form a carbon-containing layer on the silicon-containing layer, thereby forming a layer including Si and C;

(c) supplying a nitrogen-containing gas into the process vessel to nitride the layer including Si and C, thereby forming a SiCN layer; and (d) supplying an oxygen-containing gas into the process vessel to oxidize the SiCN layer, thereby forming a SiOCN layer.

When starting the study, the inventors thought that SiO would be obtained instead of SiOCN by oxidizing SiCN. This is because the inventors thought that since a binding force of a Si—O bond is stronger than that of a Si—N bond or a Si—C bond of SiCN, the Si—N bond and the Si—C bond of SiCN would be broken and C and N from which Si is broken would be separated from the SiCN while a Si—O bond was formed in an oxidation process.

Accordingly, when starting the study, the inventors were planning to form SiOCN by alternately repeating deposition of SiCN onto a wafer and deposition of SiO onto SiCN and alternately stacking SiCN and SiO. However, the inventors have made much research and found that SiOCN may be properly formed as C and N separated by oxidation may be left by controlling an oxidizing force (in particular, a dilution rate, a supply time, and a partial pressure of an oxygen-containing gas) during oxidation of SiCN. The present invention is based on these facts acquired by the inventors.

Hereinafter, the first sequence according to the embodiment of the present invention will be described in detail. Here, an example where a SiOCN film serving as an insulating film is formed on a substrate through the sequence of FIG. 3 using HCD gas as a silicon-containing gas, $C_3H_6$ gas as a carbon-containing gas, $NH_3$ gas as a nitrogen-containing gas, and $O_2$ gas as an oxygen-containing gas will be described.

As shown in FIG. 1, when a plurality of wafers 200 are charged onto the boat 217 (wafer charging), the boat 217 supporting the plurality of wafers 200 is lifted by the boat elevator 115 and loaded into the process chamber 201 (boat loading). In this state, the seal cap 219 seals a lower end of the reaction tube 203 via the O-ring 220.

An interior of the process chamber 201 is vacuum-exhausted by the vacuum pump 246 such that a pressure in the process chamber 201 becomes a desired pressure (vacuum degree). In this case, the pressure in the process chamber 201 is measured by the pressure sensor 245 and the APC valve 244 is feedback-controlled based on measured pressure information (pressure regulation). Also, an interior of the process chamber 201 is heated by the heater 207 so that an temperature in the process chamber 201 becomes a desired temperature. In this case, power supplied to the heater 207 is feedback-controlled based on temperature information detected by the temperature sensor 263 so that the interior of the process chamber 201 has a desired temperature distribution (temperature regulation). Subsequently, the wafers 200 are rotated when the boat 217 is rotated by the boat rotating mechanism 267 (wafer rotation). Thereafter, four steps to be described below are sequentially performed.

[First Step]

The valve 243a of the first gas supply pipe 232a is opened to flow HCD gas into the first gas supply pipe 232a. A flow rate of the HCD gas that flows in the first gas supply pipe 232a is regulated by the MFC 241a. The HCD gas whose flow rate has been regulated is supplied into the process chamber 201 through the gas supply hole 250a of the first nozzle 249a and is exhausted through the exhaust pipe 231. In this case, the valve 243e is opened to flow an inert gas such as $N_2$ gas into the inert gas supply pipe 232e. A flow rate of the $N_2$ gas that flows in the inert gas supply pipe 232e is regulated by the MFC 241e. The $N_2$ gas whose flow rate has been regulated is supplied into the process chamber 201 together with the HCD gas and exhausted through the exhaust pipe 231.

In this case, a pressure in the process chamber 201 is set, for example, to a range of 10 to 1,000 Pa by properly regulating the APC valve 244. A flow rate of supplied HCD gas controlled by the MFC 241a is set, for example, to a range of 10 to 1,000 sccm. A flow rate of supplied $N_2$ gas controlled by the MFC 241e is set, for example, to a range of 200 to 2,000 sccm. A time taken to expose the wafer 200 to the HCD gas, i.e., a gas supply time (irradiation time), is set, for example, to a range of 1 to 120 seconds. In this case, a temperature of the heater 207 is set, for example, to a temperature at which a CVD reaction may be caused in the process chamber 201, i.e., a temperature at which the wafer 200 has a temperature range of, for example, 300 to 650° C. When the temperature of the wafer 200 is less than 300° C., adsorption of HCD onto the wafer 200 is difficult. Also, when the temperature of the wafer 200 exceeds 650° C., uniformity is deteriorated due to a strong CVD reaction. Thus, the temperature of the wafer 200 is preferably set to a range of 300 to 650° C.

A first layer including Si is formed on an underlayer film on a surface of the wafer 200 by supplying HCD gas. That is, a Si layer serving as a silicon-containing layer of less than one atomic layer to several atomic layers is formed on the wafer 200 (on the underlayer film). The silicon-containing layer may be a chemical adsorption layer of HCD. Si is an element that becomes solid by itself. Here, in addition to a continuous layer composed of Si, the Si layer includes a discontinuous layer or a thin film formed by overlaying the continuous layer and the discontinuous layer. Also, the continuous layer composed of Si is often referred to as a thin film. The chemical adsorption layer of HCD includes, in addition to a continuous chemical adsorption layer of HCD molecules, a discontinuous chemical adsorption layer of HCD molecules. Also, a layer of less than one atomic layer means a discontinuously formed atomic layer. When a thickness of the silicon-containing layer formed on the wafer 200 exceeds that of several atomic layers, a nitriding operation in a third step to be described below does not affect the entire silicon-containing layer. Also, a minimum value of a silicon-containing layer, which may be formed on the wafer 200, is less than one atomic layer. Thus, a thickness of the silicon-containing layer is preferably set to less than one atomic layer to several atomic layers. Also, Si is deposited on the wafer 200 to form a Si layer under a condition where HCD gas is self-decomposed, whereas HCD is chemically adsorbed on the wafer 200 to form a chemical adsorption layer of HCD under a condition where HCD gas is not self-decomposed. It is more preferable to form a Si layer on the wafer 200 than to form a chemical adsorption layer of HCD on the wafer 200 in order to increase a film-forming rate.

After the silicon-containing layer is formed, the valve 243a is closed to stop supply of the HCD gas. In this case, the APC valve 244 of the exhaust pipe 231 is kept open to vacuum-exhaust the interior of the process chamber 201 using the vacuum pump 246, and the residual HCD gas in the process chamber 201 which has not reacted or has contributed to formation of the silicon-containing layer is removed from the process chamber 201. In this case, the valve 243e is kept open to maintain supply of the $N_2$ gas into the process chamber 201. Accordingly, the residual HCD gas in the process chamber 201 which has not reacted or has contributed to formation of the silicon-containing layer may be effectively removed from the process chamber 201.

The silicon-containing gas may be, in addition to the HCD gas, an organic source such as amino silane-based tetrakis-dimethylaminosilane ($Si[N(CH_3)_2]_4$, 4DMAS) gas, trisdim-ethylaminosilane ($Si[N(CH_3)_2]_3H$, 3DMAS) gas, bisdiethyl-aminosilane ($Si[N(C_2H_5)_2]_2H_2$, 2DEAS) gas, and bistertiarybutylaminosilane ($SiH_2[NH(C_4H_9)]_2$, BTBAS), as well as an inorganic source such as tetrachlorosilane ($SiCl_4$, STC) gas, trichlorosilane ($SiHCl_3$, TCS) gas, dichlorosilane ($SiH_2Cl_2$, DCS) gas, monochlorosilane ($SiH_3Cl$, MCS) gas, and monosilane ($SiH_4$) gas. The inert gas may include a noble gas such as Ar gas, He gas, Ne gas, and Xe gas, in addition to $N_2$ gas.

[Second Step]

After the first step is completed and the residual gas in the process chamber 201 is removed, the valve 243b of the second gas supply pipe 232b is opened to flow $C_3H_6$ gas into the second gas supply pipe 232b. A flow rate of the $C_3H_6$ gas that flows in the second gas supply pipe 232b is regulated by the MFC 241b. The $C_3H_6$ gas whose flow rate has been regulated is supplied into the process chamber 201 through a gas supply hole 250b of the second nozzle 249b and is exhausted through the exhaust pipe 231. Also, the $C_3H_6$ gas supplied into the process chamber 201 is thermally activated. In this case, the valve 243f is opened to flow $N_2$ gas into the inert gas supply pipe 232f at the same time. The $N_2$ gas is supplied into the process chamber 201 together with $C_3H_6$ gas and is exhausted through the exhaust pipe 231.

In this case, a pressure in the process chamber 201 is set, for example, to a range of 50 to 3,000 Pa by properly controlling the APC valve 244. A flow rate of supplied $C_3H_6$ gas controlled by the MFC 241b is set, for example, to a range of 100 to 10,000 sccm. A flow rate of supplied $N_2$ gas controlled by the MFC 241f is set, for example, to a range of 200 to 2,000 sccm. In this case, a partial pressure of the $C_3H_6$ gas in the process chamber 201 is regulated to a range of 6 to 2,940 Pa. An exposure time of the $C_3H_6$ gas to the wafer 200, i.e., a gas supply time (irradiation time), is set, for example, to a range of 1 to 120 seconds. In this case, a temperature of the heater 207 is set such that the temperature of the wafer 200 becomes 300° C. to 650° C. as in the first step. Since a soft reaction may be caused by thermally activating and supplying the $C_3H_6$ gas, a carbon-containing layer to be described below may be easily formed.

In this case, the gas flowing into the process chamber 201 is thermally activated $C_3H_6$ gas, and HCD gas does not flow into the process chamber 201. Thus, the $C_3H_6$ gas does not cause a vapor phase reaction and is activated and supplied to the wafer 200. In this case, a carbon-containing layer of less than one atomic layer, i.e., a discontinuous carbon-containing layer, is formed on the silicon-containing layer formed on the wafer 200 in the first step. Accordingly, the second layer including Si and C is formed. The second layer including Si and C may be formed by reacting a portion of the silicon-containing layer with the $C_3H_6$ gas and modifying (carbonizing) the silicon-containing layer depending on conditions.

The carbon-containing layer formed on the silicon-containing layer may be a C layer or may be a chemical adsorption layer of a carbon-containing gas ($C_3H_6$), that is, a chemical adsorption layer of a material ($C_xH_y$) produced by decomposing $C_3H_6$. Here, the carbon layer needs to be a discontinuous layer composed of C. In addition, the chemical adsorption layer of $C_xH_y$ needs to be a discontinuous chemical adsorption layer of $C_xH_y$ molecules. When the carbon-containing layer formed on the silicon-containing layer is a continuous layer, for example, when a continuous chemical adsorption layer of $C_xH_y$ is formed on a silicon-containing layer with adsorption of $C_xH_y$ onto the silicon-containing layer being in a saturated state, a surface of the silicon-containing layer is entirely covered with the chemical adsorption layer of $C_xH_y$. In this case, since silicon is not present on a surface of the second layer, nitriding the second layer in the third step to be described below is difficult. This is because N binds to Si but does not bind to C. In order to cause a desired nitridation reaction in the third step to be described below, adsorption of $C_xH_y$ onto the silicon-containing layer is in an unsaturated state, and thus a surface of the second layer needs to be a state where silicon is exposed.

In order to make the adsorption of $C_xH_y$ onto the silicon-containing layer in an unsaturated state, the processing conditions in the second step may preferably be set to the above-described processing conditions. Furthermore, when the processing conditions in the second step are set to the following processing conditions, it becomes easy to make an adsorption state of $C_xH_y$ onto a silicon-containing layer an unsaturated state.

Temperature of wafer: 500 to 630° C.
Pressure in process chamber: 133 to 2,666 Pa
Partial pressure of $C_3H_6$ gas: 67 to 2,820 Pa
Flow rate of supplied $C_3H_6$ gas: 1,000 to 5,000 sccm
Flow rate of supplied $N_2$ gas: 300 to 1,000 sccm
Supply time of $C_3H_6$ gas: 6 to 100 seconds Thereafter, the valve 243b of the second gas supply pipe 232b is closed to stop supply of the $C_3H_6$ gas. In this case, the APC valve 244 of the exhaust pipe 231 is kept open to vacuum-exhaust the interior of the process chamber 201 using the vacuum pump 246, and the residual $C_3H_6$ gas in the process chamber 201 which has not reacted or has contributed to formation of the carbon-containing layer is removed from the process chamber 201. In this case, the valve 243f is also kept open to maintain supply of the $N_2$ gas into the process chamber 201. Accordingly, the residual $C_3H_6$ gas in the process chamber 201 which has not reacted or has contributed to formation of the carbon-containing layer can be effectively removed from the process chamber 201.

The carbon-containing gas may be acetylene ($C_2H_2$) gas or ethylene ($C_2H_4$) gas in addition to $C_3H_6$ gas.

[Third Step]

After the residual gas in the process chamber 201 is removed, the valve 243c of the third gas supply pipe 232c is opened to flow $NH_3$ gas into the third gas supply pipe 232c. A flow rate of the $NH_3$ gas that flows in the third gas supply pipe 232c is regulated by the MFC 241c. The $NH_3$ gas whose flow rate has been regulated is supplied into the process chamber 201 through a gas supply hole 250c of the third nozzle 249c and is exhausted through the exhaust pipe 231. The $NH_3$ gas supplied into the process chamber 201 is thermally activated. In this case, the valve 243g is opened to flow the $N_2$ gas into the inert gas supply pipe 232g at the same time. The $N_2$ gas is supplied into the process chamber 201 together with the $NH_3$ gas and is exhausted through the exhaust pipe 231.

In this case, when the $NH_3$ gas is thermally activated and allowed to flow, a pressure in the process chamber 201 is regulated, for example, to a range of 50 to 3,000 Pa by properly controlling the APC valve 244. A flow rate of supplied $NH_3$ gas controlled by the MFC 241c is set, for example, to a range of 100 to 10,000 sccm. A flow rate of supplied $N_2$ gas controlled by the MFC 241g is set, for example, to a range of 200 to 2,000 sccm. In this case, a partial pressure of the $NH_3$ gas in the process chamber 201 is set to a range of 6 to 2,940 Pa. An exposure time of the $NH_3$ gas to the wafer 200, i.e., a gas supply time (irradiation time), is set, for example, to a range of 1 to 120 seconds. In this case, a temperature of the heater 207 is set such that a temperature of the wafer 200 becomes, for example, 300° C. to 650° C. as in the first step. Since the $NH_3$ gas has a high reaction temperature and is difficult to react at the above-described wafer temperature, the $NH_3$ gas may be thermally activated when the pressure in the process chamber 201 is relatively high as described above. Since a soft reaction may be caused by thermally activating and supplying the $NH_3$ gas, a nitridation reaction to be described below may be softly performed.

In this case, the gas flowing in the process chamber 201 is thermally activated $NH_3$ gas, and neither HCD gas nor $C_3H_6$ gas flows in the process chamber 201. Thus, the $NH_3$ gas does not cause a vapor phase reaction, and the activated $NH_3$ gas reacts with a portion of a layer including Si and C which is the second layer formed on the wafer 200 in the second step. Accordingly, the second layer is thermally nitrided in a non-plasma environment so that the second layer is changed into the third layer including Si, C, and N, i.e., a silicon carbonitride layer (a SiCN layer).

In this case, the nitridation reaction of the second layer is not allowed to be saturated. For example, when a Si layer of several atomic layers is formed in the first step and a carbon-containing layer of less than one atomic layer is formed in the second step, a portion of the surface layer (one atomic layer of the surface) thereof is nitrided. That is, some or all portion of an area (an area where silicon is exposed) where nitridation may be caused of the surface layer thereof is nitrided. In this case, nitridation is performed under a condition where a nitridation reaction of the second layer is unsaturated so that the entire second layer cannot be nitrided. Although several layers below the surface layer of the second layer may be nitrided depending on conditions, only the surface layer is preferably nitrided to enhance the controllability of the composition ratio of the SiOCN film. For example, when a Si layer of one atomic layer or less than one atomic layer is formed in the first step and a carbon-containing layer of less than one atomic layer is formed in the second step, a portion of the surface layer thereof is nitrided likewise. Even in this case, nitridation is also performed under a condition where a nitridation reaction of the second layer is unsaturated so that the second layer cannot be entirely nitrided.

In order to make the nitridation reaction of the second layer in an unsaturated state, the processing conditions in the third step preferably may be set to the above-described processing conditions. Furthermore, when processing conditions in the third step are set to the following processing conditions, it becomes easy to make a nitridation reaction of the second layer in an unsaturated state.

Temperature of wafer: 500 to 630° C.
Pressure in process chamber: 133 to 2,666 Pa
Partial pressure of $NH_3$ gas: 67 to 2,820 Pa
Flow rate of supplied $NH_3$ gas: 1,000 to 5,000 sccm
Flow rate of supplied $N_2$ gas: 300 to 1,000 sccm
Supply time of $NH_3$ gas: 6 to 100 seconds Thereafter, the valve 243c of the third gas supply pipe 232c is closed to stop supply of the $NH_3$ gas. In this case, the APC valve 244 of the exhaust pipe 231 is kept open to vacuum-exhaust the interior of the process chamber using the vacuum pump 246, and the residual $NH_3$ gas in the process chamber 201 which has not reacted or has contributed to the nitridation is removed from the process chamber 201. In this case, the valve 243g is also kept open to maintain supply of the $N_2$ gas into the process chamber 201. Accordingly, the residual $NH_3$ gas in the process chamber 201 which has not reacted or has contributed to the nitridation may be effectively removed from the process chamber 201.

The nitrogen-containing gas may be diazine ($N_2H_2$) gas, hydrazine ($N_2H_4$) gas or $N_3H_8$ gas in addition to $NH_3$ gas.

[Fourth Step]

After the residual gas in the process chamber 201 is removed, the valve 243d of the fourth gas supply pipe 232d and the valve 243h of the fourth inert gas supply pipe 232h are opened to flow the $O_2$ gas into the fourth gas supply pipe 232d and flow the $N_2$ gas into the fourth inert gas supply pipe 232h. A flow rate of the $N_2$ gas that flows in the fourth inert gas supply pipe 232h is regulated by the MFC 241h. A flow rate of the $O_2$ gas that flows in the fourth gas supply gas pipe 232d is regulated by the MFC 241d. In the fourth gas supply pipe 232d, the $O_2$ gas whose flow rate has been regulated is mixed with the $N_2$ gas whose flow rate has been regulated and is supplied into the buffer chamber 237 through the gas supply hole 250d of the fourth nozzle 249d. In this case, a high-frequency power is not applied between the first rod-shaped electrode 269 and the second rod-shaped electrode 270. Accordingly, after the $O_2$ gas supplied into the buffer chamber 237 is thermally activated, the $O_2$ gas is directed toward the wafer 200 and supplied into the process chamber 201 through the gas supply hole 250e, and is exhausted through the exhaust chamber 231. In this case, the $O_2$ gas supplied into the buffer chamber 237 may be activated using plasma by applying high-frequency power between the first rod-shaped electrode 269 and the second rod-shaped electrode 270.

When the $O_2$ gas is thermally activated and allowed to flow, a pressure in the process chamber 201 is set, for example, to a range of 1 to 3,000 Pa by properly regulating the APC valve 244. A flow rate of supplied $O_2$ gas controlled by the MFC 241d is set, for example, to a range of 100 to 5,000 sccm (0.1 to 5 slm). A flow rate of supplied $N_2$ gas controlled by the MFC 241h is set, for example, to a range of 200 to 2,000 sccm (0.2 to 2 slm). In this case, a partial pressure of the $O_2$ gas in the process chamber 201 is set to a range of 6 to 2,940 Pa. An exposure time of the wafer 200 to the $O_2$ gas, i.e., a gas supply time (irradiation time), is set, for example, to a range of 1 to 120 seconds. In this case, a temperature of the heater 207 is set such that a temperature of the wafer 200 falls within a range of 300 to 650° C. as in the first through third steps. The $O_2$ gas is thermally activated under the above-described conditions. Since a soft reaction may be caused by thermally activating and supplying the $O_2$ gas, an oxidation reaction to be described below may be softly performed.

In this case, the gas flowing into the process chamber 201 is thermally activated $O_2$ gas, and none of the HCD gas, the $C_3H_6$ gas, and the $NH_3$ gas flows in the process chamber 201. Thus, the $O_2$ gas does not cause a vapor phase reaction, and the activated $O_2$ gas reacts with a portion of a SiCN layer serving as the third layer formed on the wafer 200 in the third step. Accordingly, the SiCN layer is thermally oxidized in a non-plasma environment so that the SiCN layer is changed into the fourth layer including Si, C, N, and O, i.e., a SiOCN layer.

In this case, the oxidation reaction of the SiCN layer is not allowed to be saturated. For example, when a SiCN layer of several atomic layers is formed in the first through third steps, at least a portion of the surface layer (one atomic layer of the surface) thereof is oxidized. In this case, oxidation is performed under a condition where the oxidation reaction of the SiCN layer is unsaturated such that the SiCN layer cannot be entirely oxidized. Although several layers below the surface layer of the SiCN layer may be oxidized depending on conditions, only the surface layer is preferably oxidized to enhance controllability of the composition ratio of the SiOCN film. For example, when a SiCN layer of one atomic layer or less than one atomic layer is formed in the first through third steps, a portion of the surface layer thereof is oxidized likewise. Even in this case, oxidation is also performed under a condition where an oxidation reaction of the SiCN layer is unsaturated so that the SiCN layer cannot be entirely oxidized.

In order to make the oxidation reaction of the SiCN layer (third layer) in an unsaturated state, the processing conditions in the fourth step preferably may be set to the above-described processing conditions. Furthermore, when processing conditions in the fourth step are set to the following processing conditions, it becomes easy to make an oxidation reaction of the second layer in an unsaturated state.

Temperature of wafer: 500 to 630° C.
Pressure in process chamber: 133 to 2,666 Pa
Partial pressure of $O_2$ gas: 67 to 2,820 Pa
Flow rate of supplied $O_2$ gas: 1,000 to 5,000 sccm
Flow rate of supplied $N_2$ gas: 300 to 1,000 sccm
Supply time of $O_2$ gas: 6 to 100 seconds Thereafter, the valve 243d of the fourth gas supply pipe 232d is closed to stop supply of the $O_2$ gas. In this case, the APC valve 244 of the exhaust pipe 231 is kept open to vacuum-exhaust the interior of the process chamber 201 using the vacuum pump 246, and the residual $O_2$ gas in the process chamber 201 which has not reacted or has contributed to oxidation is removed from the process chamber 201. In this case, the valve 243h is kept open to maintain supply of the $N_2$ gas into the process chamber 201. Accordingly, the residual $O_2$ gas in the process chamber 201 which has not reacted or has contributed to oxidation may be effectively removed from the process chamber 201

The oxygen-containing gas may include, vapor ($H_2O$) gas, nitrogen monoxide (NO) gas, nitrous oxide ($N_2O$) gas, nitrogen dioxide ($NO_2$) gas, carbon monoxide (CO) gas, carbon dioxide ($CO_2$) gas, ozone ($O_3$) gas, a mixture of $H_2$ gas and $O_2$ gas, a mixture of $H_2$ gas and $O_3$ gas, etc., in addition to $O_2$ gas.

A thin film including Si, C, N, and O, i.e., a SiOCN film, having a predetermined thickness may be formed on the wafer 200 by performing a cycle including the above-described first through fourth steps once or more. The above-described cycle is preferably repeatedly performed a plurality of times.

In this case, ratios of each of the element components in the SiOCN layer, i.e., a Si component, an O component, a C component and a N component, that is, a Si concentration, an O concentration, a C concentration and a N concentration may be regulated by controlling process conditions such as a pressure in the process chamber 201 or a gas supply time in the respective steps so that a composition ratio of the SiOCN film may be controlled.

A SiOCN film having a predetermined thickness may be formed on the wafer 200 by performing, once or more, a cycle including a process of carrying out a set of steps including the above-described first through third steps once or more, and a process of carrying out the fourth step afterwards That is, a SiOCN film having a predetermined thickness may be formed on a wafer 200 by performing, a predetermined number of times (n times), a cycle including steps of:

(a) performing a set of steps including (a-1) supplying a silicon-containing gas (HCD gas) into a process vessel accommodating the wafer 200 under a condition where a CVD reaction is caused to form a silicon-containing layer on the wafer 200 (first step), (a-2) supplying a carbon-containing gas ($C_3H_6$ gas) into the process vessel to form a carbon-containing layer on the silicon-containing layer, thereby forming a layer containing Si and C (second step), and (a-3) supplying a nitrogen-containing gas into the process vessel to nitride the layer including Si and C, thereby forming a SiCN layer (third step), the set of steps being performed a predetermined number of times (m times) to form the SiCN layer having a predetermined thickness; and (b) supplying an oxygen-containing gas ($O_2$ gas) into the process vessel to oxidize the SiCN layer having the predetermined thickness, thereby forming a SiOCN layer (fourth step). In this case as well, the above-described cycle is preferably repeated a plurality of times.

Figure 4:
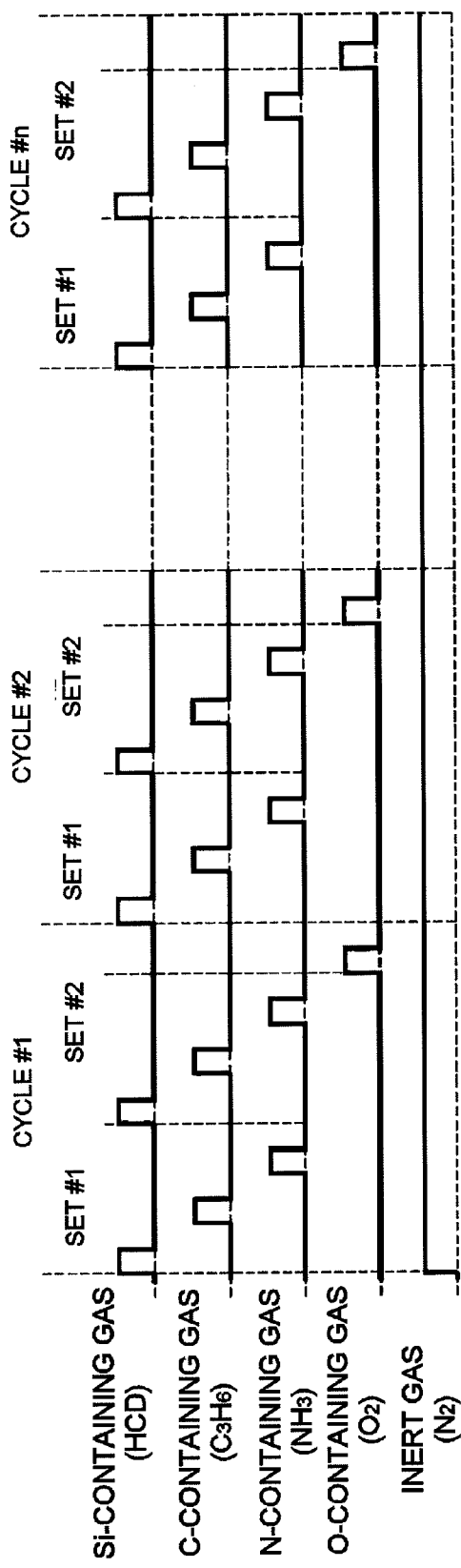
FIG. 4 is a diagram illustrating gas supply timings in a modified example of the first sequence according to the embodiment of the present invention.

FIG. 4 exemplifies formation of a SiOCN film having a predetermined thickness on the wafer 200 by performing, n times, a cycle which includes a process of carrying out a set of the first through third steps twice, and a process of carrying out the fourth step afterwards.

In this way, the ratio of a Si component, a C component, and a N component to an O component of a SiOCN film may be controlled properly (in a rich direction) by performing, a predetermined number of times, a cycle including a process of carrying out a set of the first through third steps a predetermined number of times, and a process of carrying out the fourth step afterwards, and thereby the controllability of a composition ratio of the SiOCN film can be enhanced more. The number of SiCN layers formed per cycle may be increased as the set of steps is increased in number, making it possible to enhance a cycle rate. Accordingly, a film-forming rate may be enhanced.

When a SiOCN film having a predetermined thickness is formed so as to have a predetermined composition, an inert gas such as $N_2$ gas is supplied into the process chamber 201 and then is exhausted such that the interior of the process chamber 201 is purged by the inert gas (gas purging). Thereafter, an atmosphere in the process chamber 201 is substituted with the inert gas (inert gas substitution), and a pressure in the process chamber 201 is returned to a normal pressure (returning to atmospheric pressure).

Thereafter, as the seal cap 219 is lowered by the boat elevator 115 and the lower end of the reaction tube 203 is opened, the processed wafer 200 is unloaded (boat unloading) out of the reaction tube 203 from a lower end of the reaction tube 203 in a state where the processed wafer 200 is supported by the boat 217. Thereafter, the processed wafer 200 is discharged from the boat 217 (wafer discharging).

(Second Sequence)

Figure 5:
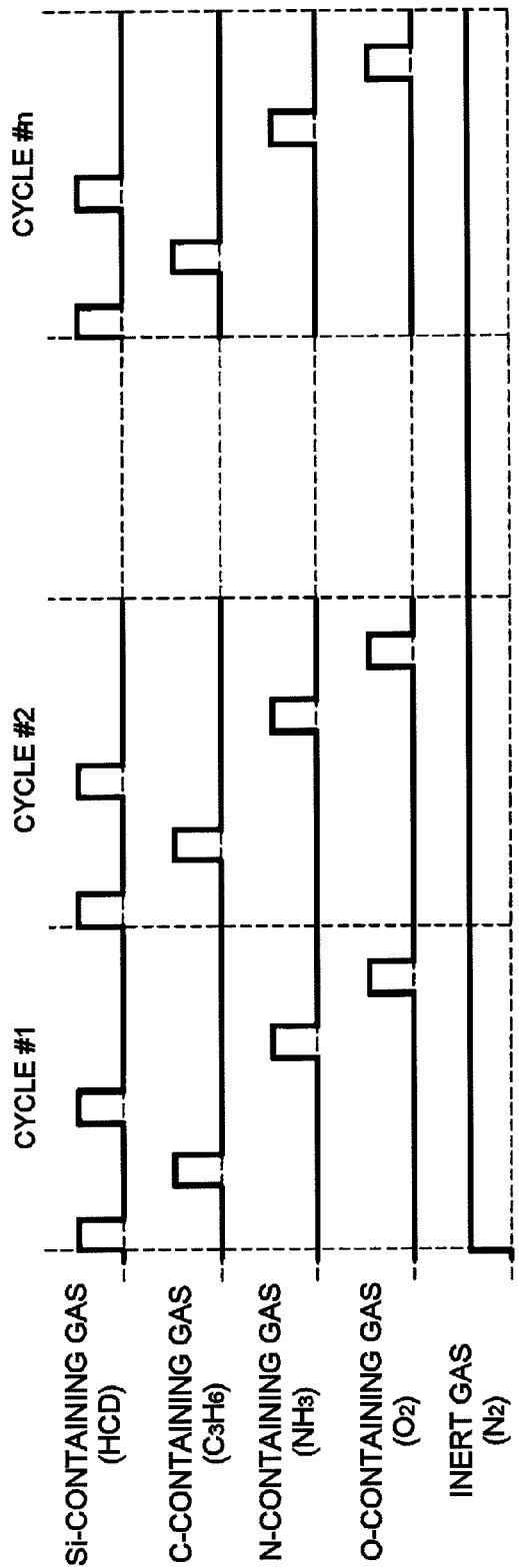
FIG. 5 is a diagram illustrating gas supply timings in a second sequence according to the embodiment of the present invention.

Next, a second sequence according to the embodiment of the present invention will be described. FIG. 5 is a timing diagram illustrating gas supply timing in a second sequence according to the embodiment of the present invention.

In the second sequence according to the embodiment of the present invention, a SiOCN film having a predetermined thickness is formed on the wafer 200 by performing, a predetermined number of times (n times), a cycle including the steps of:

(a) supplying a silicon-containing gas into a process vessel accommodating the wafer 200 under a condition where a CVD reaction is caused to form a silicon-containing layer on the wafer 200;

(b) supplying a carbon-containing gas into the process vessel to form a carbon-containing layer on the silicon-containing layer, thereby forming a first layer including Si and C;

(c) supplying a silicon-containing gas into the process vessel under a condition where a CVD reaction is caused to form a silicon-containing layer on the first layer including Si and C additionally, thereby forming a second layer including Si and C additionally;

(d) supplying a nitrogen-containing gas into the process vessel to nitride the second layer including Si and C, thereby forming a SiCN layer; and (e) supplying an oxygen-containing gas into the process vessel to oxidize the SiCN layer, thereby forming a SiOCN layer.

Hereinafter, the second sequence according to the embodiment of the present invention will be described in detail. Here, an example where a SiOCN film serving as an insulating film is formed on a substrate through the sequence of FIG. 5, using HCD gas as a silicon-containing gas, $C_3H_6$ gas as a carbon-containing gas, $NH_3$ gas as a nitrogen-containing gas, and $O_2$ gas as an oxygen-containing gas will be described.

The second sequence is performed in the same manner as in the first second sequence until the wafer charging, the boat loading, the pressure regulation, the temperature regulation and the wafer rotation are performed. Thereafter, five steps to be described below are sequentially performed.

[First Step]

The first step is performed in the same manner as in the first step of the first sequence. That is, processing conditions, a reaction to be caused, a layer to be formed, etc. of the first step are the same as those of the first step of the first sequence. That is, in this step, a silicon-containing layer is formed on a wafer 200 by supplying HCD gas into the process chamber 201.

[Second Step]

The second step is performed in the same manner as in the second step of the first sequence. That is, processing conditions, a reaction to be caused, a layer to be formed, etc. of the second step are the same as those of the second step of the first sequence. That is, in this step, a first layer including Si and C is formed by supplying $C_3H_6$ gas into the process chamber 201 and forming a carbon-containing layer on a silicon-containing layer.

[Third Step]

The third step is performed in the same manner as in the first step of the first sequence. That is, processing conditions, a reaction to be caused, a layer to be formed, etc. of the third step are the same as those of the first step of the first sequence. That is, in this step, a second layer including Si and C is formed by supplying HCD gas into the process chamber 201 and forming a silicon-containing layer on the first layer including Si and C.

[Fourth Step]

The fourth step is performed in the same manner as in the third step of the first sequence. That is, processing conditions, a reaction to be caused, a layer to be formed, etc. of the fourth step are the same as those of the third step of the first sequence. That is, in this step, a SiCN layer is formed by supplying $NH_3$ gas into the process chamber 201 and nitriding the second layer including Si and C to form a SiCN layer.

[Fifth Step]

The fifth step is performed in the same manner as in the fourth step of the first sequence. That is, processing conditions, a reaction to be caused, a layer to be formed, etc. of the fifth step are the same as those of the fourth step of the first sequence. That is, in this step, a SiOCN layer is formed by supplying $O_2$ gas into the process chamber 201 and oxidizing the SiCN layer.

A SiOCN film having a predetermined thickness may be formed on the wafer 200 by performing a cycle including the above-described first through fifth steps once or more. The above-described cycle is preferably repeated a plurality of times.

In this case, ratios of each of the element components in the SiOCN layer, i.e., a Si component, an O component, a C component and a N component, that is, a Si concentration, an O concentration, a C concentration and a N concentration, may be regulated by controlling process conditions such as a pressure in the process chamber 201 or a gas supply time in the respective steps so that a composition ratio of the SiOCN film can be controlled.

A SiOCN film having a predetermined thickness may be formed on the wafer 200 by performing, once or more, a cycle including a process of carrying out a set of steps including the above-described first through fourth steps once or more, and a process of carrying out the fifth step afterwards.

That is, a SiOCN film having a predetermined thickness may be formed on the wafer 200 by performing, a predetermined number of times (n times), a cycle including steps of:

(a) performing a set of steps including (a-1) supplying a silicon-containing gas (HCD gas) into a process vessel accommodating the wafer 200 under a condition where a CVD reaction is caused to form a silicon-containing layer on the wafer 200 (first step), (a-2) supplying a carbon-containing gas ($C_3H_6$ gas) into the process vessel to form a carbon-containing layer on the silicon-containing layer, thereby forming a first layer including Si and C (second step), (a-3) supplying a silicon-containing gas (HCD gas) into the process vessel under a condition where a CVD reaction is caused to form a silicon-containing layer on the first layer including Si and C additionally, thereby forming a second layer including Si and C (third step), (a-4) supplying a nitrogen-containing gas into the process vessel to nitride the second layer including Si and C, thereby forming a SiCN layer (fourth step), the set of steps being performed a predetermined number of times (m times) to form a SiCN layer having a predetermined thickness; and (b) supplying an oxygen-containing gas ($O_2$ gas) into the process vessel to oxidize the SiCN layer having the predetermined thickness, thereby forming a SiOCN layer (fifth step). In this case as well, the above-described cycle is preferably repeated a plurality of times.

Figure 6:
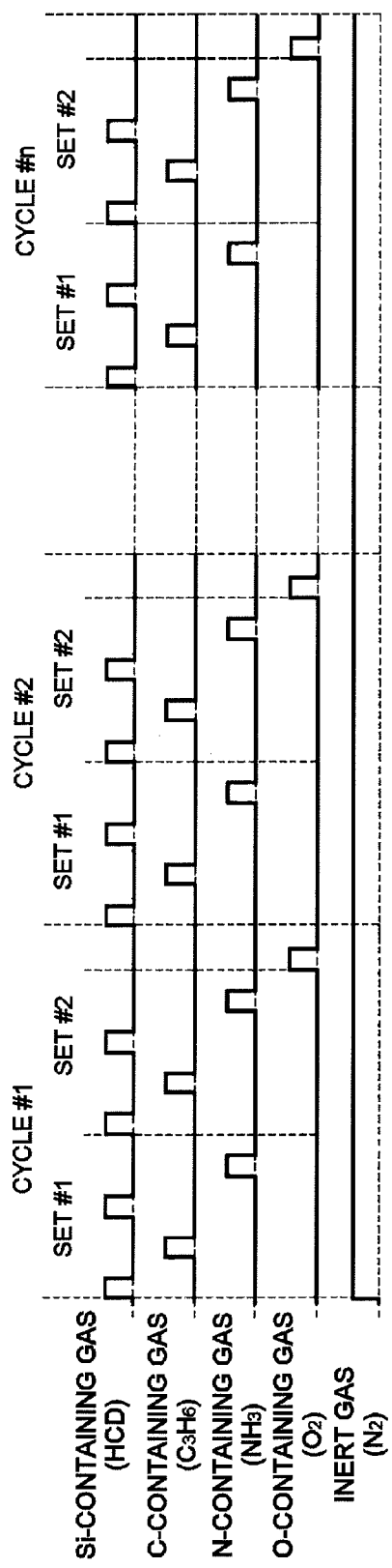
FIG. 6 is a diagram illustrating gas supply timings in a modified example of the second sequence according to the embodiment of the present invention.

FIG. 6 exemplifies formation of a SiOCN film having a predetermined thickness on the wafer 200 by performing, n times, a cycle which includes a process of carrying out a set of the first through fourth steps twice, and a process of carrying out the fifth step afterwards.

In this way, the ratio of a Si component, a C component, and a N component to an O component of a SiOCN film may be controlled properly (in a rich direction) by performing, a predetermined number of times, a cycle including a process of carrying out a set of the first through fourth steps a predetermined number of times, and a process of carrying out the fifth step afterwards, and thereby the controllability of a composition ratio of the SiOCN film can be enhanced more. The number of SiCN layers formed per cycle may be increased as the set of steps is increased in number, making it possible to enhance a cycle rate. Accordingly, a film-forming rate may be enhanced.

In the first sequence, HCD gas is supplied at least once per cycle (first step) to form at least one silicon layer per cycle.

In this regard, in the second sequence, HCD gas may be supplied at least twice per cycle (first step and third step) to form at least two silicon layers per cycle. That is, according to the second sequence, an amount of Si adsorbed and deposited per cycle may be increased as compared with the first sequence (more than two times), making it possible to enhance a cycle rate.

In the first sequence, when C, i.e., $C_xH_y$, is adsorbed onto a Si layer by supplying $C_3H_6$ gas in the second step, a Si—C bond is created. Thereafter, when N, i.e., $NH_3$ gas, is supplied in the third step, since C and N are apt to competitively gain Si, a portion of the Si—C bond is substituted with Si—N bond. Thus, C may be separated. As a result, an amount of C introduced into a SiCN film, i.e. a C concentration in the SiCN film, may be reduced in the first sequence.

In this regard, according to the second sequence, C, i.e., $C_xH_y$, is adsorbed onto a Si layer by supplying $C_3H_6$ gas in the second step and Si is adsorbed and deposited in the third step, resulting in increased probability of forming a Si—C—Si bond. Thereafter, even when N, i.e. $NH_3$ gas, is supplied in the fourth step, an attack of N is blocked by Si forming the Si—C—Si bond, and thus separation of C may be difficult and C may easily remain. As a result, an amount of C introduced to the SiCN, i.e. a C concentration in the SiCN film, is enhanced.

In the first sequence, both adsorption of $C_xH_y$ onto the Si layer in the second step and nitridation of the second layer by $NH_3$ gas in the third step need to be stopped when the adsorption and the nitridation are in an unsaturated state. When nitridation of the second layer by $NH_3$ gas in the third step is saturated, a large amount of C is separated and a C concentration in the SiCN film is severely lowered.

In this regard, as described above, according to the second sequence, $C_xH_y$ is adsorbed onto a Si layer in the second step and Si is adsorbed and deposited in the third step, causing a probability of forming a Si—C—Si bond to be increased so that the Si forming the Si—C—Si bond functions as a block layer of C against an attack of N in the fourth step. Accordingly, saturating nitridation of the third layer by $NH_3$ gas in the fourth step is possible. That is, a nitriding force may be increased and more uniform nitridation becomes possible while separation of C is being restrained. As a result, uniformity in a film thickness on a wafer surface of a SiCN film may be enhanced.

When a SiOCN film having a predetermined composition ratio and a predetermined thickness is formed, the gas purging, the inert gas substitution, the returning to the atmospheric pressure, the boat unloading, and the wafer discharging are performed in the same manner as in the first sequence.

(3) Effects of the Embodiment of the Present Invention

The embodiment of the present invention has one or plural effects as follows.

According to the embodiment of the present invention, in the first sequence, the first through fourth steps are sequentially performed in order, or after a set of steps, i.e., the first through third steps, is performed once or more, the fourth step is performed. Thus, a SiOCN film having a predetermined composition ratio and a predetermined thickness may be formed. Further, in the second sequence, the first through fifth steps are sequentially performed in order, or after a set of steps, i.e., the first through fourth steps, is performed once or more, the fifth step is performed. Thus, a SiOCN film having a predetermined composition ratio and a predetermined thickness may be formed.

It was confirmed that when the order of the steps in the sequences was changed, for example, the first sequence was performed in the order of the first step, the second step, the fourth step, and the third step, a SiOCN film could not be obtained. It was also confirmed that when the first step, the second step, the third step, the fifth step, and the fourth step were sequentially performed in the second sequence, a SiOCN film could not be obtained. This is because since a binding force of a Si—O bond is stronger than that of a Si—N bond, a layer including Si and C may be oxidized after the layer is nitrided, but the layer including Si and C may not be nitrided after the layer is oxidized. This is because, since a Si—O bond is formed after the layer is oxidized, even when $NH_3$ flows in the state, the Si—O bond may not be broken, and thus a Si—N bond may not be formed. It was also confirmed that after oxidation of the layer including Si and C, the layer may not nitrided even when $NH_3$ gas was activated in a plasma environment by a plasma source in the buffer chamber, and a SiOCN film may not be obtained. Accordingly, it was proved that even when the layer including Si and C is nitrided after the layer is oxidized, a SiOCN film may not be obtained, and the layer including Si and C needs to be oxidized after being nitrided to obtain a SiOCN film.

According to the embodiment of the present invention, a SiOCN film having an excellent uniformity in film thickness in a wafer surface may be formed in any one of the first sequence and the second sequence. When a SiOCN film formed through the first sequence or the second sequence of the embodiment of the present invention is used as an insulating film, it is possible to provide a uniform performance in a surface of the SiOCN film and to contribute to enhancing a performance of a semiconductor device or enhancing a production rate.

According to the embodiment of the present invention, ratios of each of the element components in the SiOCN layer, i.e., a Si component, an O component, a C component and a N component, that is, a Si concentration, an O concentration, a C concentration and a N concentration, may be regulated by controlling process conditions such as a pressure in the process chamber or a gas supply time in the respective steps so that a composition ratio of the SiOCN film can be controlled.

Then, in a conventional CVD method, a plurality of kinds of gases including a plurality of elements constituting a thin film to be formed are simultaneously supplied. In this case, in order to control a composition ratio of a formed thin film, controlling the ratio of flow rates of supplied gases during supply of the gases can be considered for example. In this case, a composition ratio of a thin film cannot be controlled even by controlling supply conditions such as a temperature of a substrate, a pressure in the process chamber, and gas supply times during supply of gases.

Also, in a conventional ALD method, a plurality of kinds of gases containing a plurality of elements constituting a thin film to be formed are alternately supplied. In this case, for example, controlling flow rates of supplied gases and gas supply times during supply of gases may be considered in order to control a composition ratio of a thin film to be formed. In the ALD method, since a source gas is supplied to be adsorbed and saturated onto a surface of a substrate, there is no need to control a pressure in the process chamber. That is, since adsorption and saturation of a source gas occur at a predetermined pressure or less to which the source gas is adsorbed at a reaction temperature, when a pressure in the process chamber is set to the predetermined pressure or less, the adsorption and saturation of the source gas may be achieved at any pressure. Accordingly, when a film is generally formed through the ALD method, the pressure in the process chamber is set to a pressure according to capability of exhausting a substrate processing apparatus with respect to an amount of supplied gas. When the pressure in the process chamber is varied, chemical adsorption of a source gas onto a surface of a substrate may be hampered or a reaction may be close to the CVD reaction, and thus film formation using the ALD method may not be properly performed. Further, since an ALD reaction (saturated adsorption, and surface reaction) is repeatedly performed in order to form a thin film having a predetermined thickness through the ALD method, unless the ALD reactions are sufficiently performed until the ALD reactions are saturated, deposition may become insufficient and deposition rate may not be sufficient. Thus, in the ALD method, it is difficult to control a composition ratio of a thin film by controlling a pressure in the process chamber.

In this regard, in the embodiment of the present invention, a composition ratio of a thin film is controlled by controlling a pressure in the process chamber or a gas supply time in respective steps in any of the sequences. Preferably, a composition ratio of a thin film may also be controlled by controlling a pressure in the process chamber or the pressure and a gas supply time.

When a composition ratio of a thin film is controlled by controlling a pressure in the process chamber in respective steps, effects caused by a difference between other substrate processing apparatuses may be reduced. That is, a composition ratio of a thin film may be controlled under the same control conditions and in the same manner even in the other substrate processing apparatuses. In this case, when a gas supply time is controlled in respective steps, a composition ratio of a thin film may be minutely regulated and a controllability of a composition ratio of the thin film may be enhanced. Also by controlling a pressure in the process chamber in respective steps, a composition ratio of a thin film may be controlled while raising a film-forming rate. That is, a composition ratio of a thin film may be controlled by controlling a pressure in the process chamber, for example, while raising a growth rate of a silicon-containing layer formed in the first steps of the respective sequences. In this way, according to the embodiment of the present invention, the composition ratio of the thin film may be controlled under the same control conditions and in the same manner even in the other substrate processing apparatuses, controllability of the composition ratio of the thin film may be enhanced, and the film formation rate, i.e. productivity may also be enhanced.

Meanwhile, for example, in forming a film through the ALD method, when a composition ratio of a thin film is controlled by controlling a flow rate of supplied gas and a gas supply time in respective steps, effects caused by a difference between other substrate processing apparatuses is increased. That is, the same control is performed to the other substrate processing apparatuses, a composition ratio of a thin film cannot be controlled in the same manner. For example, even when the flow rates of supplied gases and gas supply times in the other substrate processing apparatuses are set to the same flow rates and gas supply times, the pressures in the process chambers do not become the same value due to the difference between the other substrate processing apparatuses. Thus, in this case, as the pressures in the process chambers are changed in the other substrate processing apparatuses, composition ratios in the substrate processing apparatuses cannot be controlled in a desired manner. When the pressures in the process chambers of the substrate processing apparatuses are varied, chemical adsorption of a source gas onto a surface of a substrate may be hampered or reactions may be close to the CVD reactions, and thus a film cannot be properly formed using the ALD method.

However, since a SiOCN film of a predetermined composition ratio may be formed according to the embodiment of the present invention, an etching-resistant property, a dielectric constant, and an insulation-resistant property may be controlled. Therefore, a silicon insulating film having a low dielectric constant, an excellent etching-resistant property and a excellent insulation-resistant property may be formed, compared to those of the SiN film.

The $C_3H_6$ gas, the $NH_3$ gas, and the $O_2$ gas supplied into the process chamber 201 are thermally activated respectively and are supplied to a surface of the wafer 200 in the second through fourth steps of the first sequence of this embodiment and in the second, fourth, and fifth steps of the second sequence. Accordingly, since each of the above-described reactions may be softly caused, formation of the carbon-containing layer, nitridation and oxidation can be easily performed with excellent controllability.

The silicon insulating film formed through the technique of the embodiment of the present invention may be used as a side wall spacer, providing a device forming technology with small leak current and excellent processing.

Also, the silicon insulating film formed through the technique of the embodiment of the present invention may be used as an etch stopper, providing a device forming technology with excellent processing.

According to the embodiment of the present invention, a silicon insulating film of an ideal stoichiometric ratio can be formed. Further, since a Si insulating film is formed without using plasma, the silicon insulating film may be applied to a process where plasma damage is concerned, for example, on an SADP film of DPT.

<Another Embodiment of the Present Invention>

Although the embodiment of the present invention has been described in detail, the present invention is not limited thereto, but may be often modified without departing from the scope of the invention.

For example, the buffer chamber 237 may not be installed inside the process chamber 201, but $O_2$ gas may be directly supplied into the process chamber 201 through the fourth nozzle 249*d*. In this case, the $O_2$ gas may be directly supplied toward the wafer 200 through the fourth nozzle 249*d* with the gas supply hole 250*d* of the fourth nozzle 249*d* facing the center of the reaction tube 203. Also, the fourth nozzle 249*d* may not be installed, but only the buffer chamber 237 may be installed.

For example, the $C_3H_6$ gas, $NH_3$ gas, and $O_2$ gas supplied into the process chamber 201 are not limited to be thermally activated, but, for example, may be activated using plasma. In this case, for example, the gases may be plasma-excited using the plasma source serving as the above-described plasma generator.

For example, a hydrogen-containing gas may be supplied together with an oxygen-containing gas in the fourth step of the first sequence and the fifth step of the second sequence. When an oxygen-containing gas and a hydrogen-containing gas are supplied into the process chamber under an atmosphere less than the atmospheric pressure (reduced pressure), the oxygen-containing gas and the hydrogen-containing gas react with each other in the process vessel to produce an oxidant (atomic oxygen etc.) including oxygen, and then the layers may be oxidized by the oxidant. In this case, oxidation can be performed with a higher oxidizing force than with that of a single oxygen-containing gas. The oxidation is performed in the absence of plasma under a reduced pressure atmosphere. For example, $H_2$ gas may be used as the hydrogen-containing gas. In this case, the above-described hydrogen-containing gas supply system may be used.

For example, in the above-described embodiment of the present invention, an example of forming a SiOCN film (a semiconductor insulating film) including Si serving as a semiconductor element as an insulating film has been explained. However, the present invention may also be applied to a case of forming a metal oxycarbonitride film (a metal insulating film) including a metal element such as titanium (Ti), zirconium (Zr), hafnium (Hf), tantalum (Ta), aluminum (Al), molybdenum (Mo), gallium (Ga), or germanium (Ge).

For example, the present invention may also be applied to a titanium oxycarbonitride film (a TiOCN film), a zirconium oxycarbonitride film (a ZrOCN film), a hafnium oxycarbonitride film (a HfOCN film), a tantalum oxycarbonitride film (a TaOCN film), an aluminum oxycarbonitride film (an AlOCN film), a molybdenum oxycarbonitride film (a MoOCN film), a gallium oxycarbonitride film (a GaOCN film), or a germanium oxycarbonitride film (a GeOCN film), or a metal oxycarbonitride film obtained by combination or mixture thereof.

In this case, a film may be formed though the same sequences (first sequence and second sequence) as in the above-described embodiments using Ti source gas, Zr source gas, Hf source gas, Ta source gas, Al source gas, Mo source gas, Ga source gas, or Ge source gas instead of the Si source gas.

That is, in this case, a metal oxycarbonitride film having a predetermined thickness is, for example, formed on a wafer in the first sequence by performing, a predetermined number of times (n times), a cycle including the steps of:

(a) supplying a source gas including a metal element into a process vessel accommodating the wafer under a condition where a CVD reaction is caused to form a layer containing the metal element on the wafer (first step), (b) supplying a carbon-containing gas into the process vessel to form a carbon-containing layer on the layer containing the metal element, thereby forming a layer including the metal element and the carbon (second step), (c) supplying a nitrogen-containing gas into the process vessel to nitride the layer including the metal element and the carbon, thereby forming a metal carbonitride layer (third step); and (d) supplying an oxygen-containing gas into the process vessel to oxidize the metal carbonitride layer, thereby forming a metal oxycarbonitride layer (fourth step).

In this case as well, as in the above-described embodiment of the present invention, the metal oxycarbonitride film having a predetermined thickness may be formed on the wafer by performing, once or more, a cycle which includes a process of carrying out a set of the first through third steps once or more, and a process of carrying out the fourth step afterwards.

That is, a metal oxycarbonitride film having a predetermined thickness may be formed on a wafer by performing, a predetermined number of times (n times), a cycle including steps of:

(a) performing a set of steps including (a-1) supplying a source gas including a metal element into a process vessel accommodating the wafer under a condition where a CVD reaction is caused to form a layer containing the metal element on the wafer (first step), (a-2) supplying a carbon-containing gas into the process vessel to form a carbon-containing layer on the layer containing the metal element, thereby forming a layer including the metal element and the carbon (second step), and (a-3) supplying a nitrogen-containing gas into the process vessel to nitride the layer including the metal element and the carbon, thereby forming a metal carbonitride layer (third step), the set of steps being performed a predetermined number of times (m times) to form the metal carbonitride layer having a predetermined thickness; and (b) supplying an oxygen-containing gas into the process vessel to oxidize the metal carbonitride layer having the predetermined thickness, thereby forming a metal oxycarbonitride layer (fourth step).

Also, in this case, a metal oxycarbonitride film having a predetermined thickness is, for example, formed on a wafer in the second sequence by performing, a predetermined number of times (n times), a cycle including the steps of:

(a) supplying a source gas including a metal element into a process vessel accommodating the wafer under a condition where a CVD reaction is caused to form a layer containing the metal element on the wafer (first step), (b) supplying a carbon-containing gas into the process vessel to form a carbon-containing layer on the layer containing the metal element, thereby forming a first layer including the metal element and the carbon (second step), (c) supplying a source gas including the metal element into the process vessel under a condition where a CVD reaction is caused to form a layer containing the metal element on the first layer including the metal element and the carbon additionally, thereby forming a second layer including the metal element and the carbon (third step), (d) supplying a nitrogen-containing gas into the process vessel to nitride the second layer including the metal element and the carbon, thereby forming a metal carbonitride layer (fourth step), and (e) supplying an oxygen-containing gas into the process vessel to oxidize the metal carbonitride layer, thereby forming a metal oxycarbonitride layer (fifth step).

In this case as well, as in the above-described embodiment of the present invention, a metal oxycarbonitride film having a predetermined thickness may be formed on a wafer by performing, once or more, a cycle which includes a process of carrying out a set of the first through fourth steps once or more, and a process of carrying out the fifth step afterwards.

That is, a metal oxycarbonitride film having a predetermined thickness may be formed on a wafer by performing, a predetermined number of times (n times), a cycle including steps of:

(a) performing a set of steps including (a-1) supplying a source gas including a metal element into a process vessel accommodating the wafer under a condition where a CVD reaction is caused to form a layer containing the metal element on the wafer (first step), (a-2) supplying a carbon-containing gas into the process vessel to form a carbon-containing layer on the layer containing the metal element, thereby forming a first layer including the metal element and the carbon (second step), (a-3) supplying a source gas including the metal element into the process vessel under a condition where a CVD reaction is caused to form a layer containing the metal element on the first layer including the metal element and the carbon, thereby forming a second layer including the metal element and the carbon (third step), and (a-4) supplying a nitrogen-containing gas into the process vessel to nidtride the second layer including the metal element and the carbon, thereby forming a metal carbonitride layer (fourth step), the set of steps being performed a predetermined number of times (m times) to form a metal carbonitride layer having a predetermined thickness; and (b) supplying an oxygen-containing gas into the process vessel to oxidize the metal carbonitride layer having the predetermined thickness, thereby forming a metal oxycarbonitride layer (fifth step).

For example, when a TiOCN film is formed as the metal oxycarbonitride film, a source containing Ti may include an organic source such as tetrakisethylmethylaminotitanium (Ti[N($C_2H_5$)($CH_3$)]$_4$, TEMAT), tetrakisdimethylaminotitanium (Ti[N($CH_3$)$_2$]$_4$, TDMAT), and tetrakisdiethylaminotitanium (Ti[N($C_2H_5$)$_2$]$_4$, TDEAT), or an inorganic source such as titanium tetrachloride ($TiCl_4$). The same gases described in the embodiment of the present invention may be used as the carbon-containing gas, the nitrogen-containing gas, or the oxygen-containing gas. In this case, the processing conditions may be, for example, set to the same processing conditions as described in the embodiment of the present invention, but a temperature of the wafer is more preferably, for example, in a range of 100 to 500° C. and a pressure in the process chamber is more preferably in a range of 1 to 1,000 Pa.

Also, for example, when a ZrOCN film is formed as the metal oxycarbonitride film, a source containing Zr may include an organic source such as tetrakisethylmethylaminozirconium (Zr[N($C_2H_5$)($CH_3$)]$_4$, TEMAZ), tetrakisdimethylaminozirconium (Zr[N($CH_3$)$_2$]$_4$, TDMAZ), and tetrakisdiethylaminozirconium (Zr[N($C_2H_5$)$_2$]$_4$, TDEAZ), or an inorganic source such as zirconium tetrachloride ($ZrCl_4$). The same gases described in the embodiment of the present invention may be used as the carbon-containing gas, the nitrogen-containing gas, or the oxygen-containing gas. Also, the processing conditions may be, for example, set to the same processing conditions as described in the embodiment of the present invention, but a temperature of the wafer is more preferably, for example, in a range of 100 to 400° C. and a pressure in the process chamber is more preferably in a range of 1 to 1,000 Pa.

Also, for example, when a HfOCN film is formed as the metal oxycarbonitride film, a source containing Hf may include an organic source such as tetrakisethylmethylaminohafnium (Hf[N($C_2H_5$)($CH_3$)]$_4$, TEMAH), tetrakisdimethylaminohafnium (H[N($CH_3$)$_2$]$_4$, TDMAH), and tetrakisdiethylaminohafnium (Hf[N($C_2H_5$)$_2$]$_4$, TDEAH), or an inorganic source such as hafnium tetrachloride ($HfCl_4$). The same gas described in the embodiment of the present invention may be used as the carbon-containing gas, the nitrogen-containing gas, or the oxygen-containing gas. Also in this case, the processing conditions may be, for example, set to the same processing conditions as described in the embodiment of the present invention, but a temperature of the wafer is more preferably, for example, in a range of 100 to 400° C. and a pressure in the process chamber is more preferably in a range of 1 to 1,000 Pa.

Also, for example, when an AlOCN film is formed as the metal oxycarbonitride film, a source containing Al may include an organic source such as trimethylaluminum (Al($CH_3$)$_3$, TMA), or an inorganic source such as trichloroaluminum ($AlCl_3$). The same gas described in the embodiment of the present invention may be used as the carbon-containing gas, the nitrogen-containing gas, or the oxygen-containing gas. Also in this case, the processing conditions may be, for example, set to the same processing conditions as described in the embodiment of the present invention, but a temperature of the wafer is more preferably, for example, in a range of 100 to 400° C. and a pressure in the process chamber is more preferably in a range of 1 to 1,000 Pa.

In this way, the present invention may be applied to formation of the metal oxycarbonitride film, in which case the same operations and effects as in the embodiment of the present invention can be obtained.

As described above, the present invention may be applied to the case of forming a oxycarbonitride film containing a certain element such as a semiconductor element or a metal element.

EXAMPLES

SiOCN films were formed while controlling composition ratios through the first sequence according to the above-described embodiment and the composition ratios of the SiOCN films and uniformity in film thicknesses in wafer surfaces were measured. HCD gas was used as the silicon-containing gas, $C_3H_6$ gas was used as the carbon-containing gas, $NH_3$ gas was used as the nitrogen-containing gas, and $O_2$ gas was used as the oxygen-containing gas. The composition ratios were controlled by regulating factors for controlling the composition ratios, i.e., a pressure, or a pressure and gas supply time (irradiation time). In controlling the composition ratios, the higher the pressure is and the longer the gas supply time is, the higher the reaction is, and thus layers formed in the corresponding steps become thicker or an adsorption amount is increased. That is, the number of atoms given in the corresponding steps becomes larger. In the meantime, when the adsorption of reaction species or a reaction by the reaction species is saturated, there is a case that a film thickness may not become thicker than one atomic layer.

First, the pressure in the process chamber and the supply time of $C_3H_6$ gas in the second step of the first sequence were regulated, and a SiOCN film having a C concentration of approximately 8 atoms % was formed on the wafer. The processing conditions then were set as follows.

<First Sequence (Reference Processing Condition)>
(First Step)
Temperature in process chamber: 630° C.
Pressure in process chamber: 133 Pa (1 Torr)
Flow rate of supplied HCD gas: 0.2 slm
Irradiation time of HCD gas: 6 seconds
(Second Step)
Temperature in process chamber: 630° C.
Pressure in process chamber: 133 Pa (1 Torr)
Flow rate of supplied $C_3H_6$ gas: 1 slm
Irradiation time of $C_3H_6$ gas: 12 seconds
(Third Step)
Temperature in process chamber: 630° C.
Pressure in process chamber: 866 Pa (6.5 Torr)
Flow rate of supplied $NH_3$ gas: 4.5 slm
Irradiation time of $NH_3$ gas: 18 seconds
(Fourth Step)
Temperature in process chamber: 630° C.
Pressure in process chamber: 133 Pa (1 Torr)
Flow rate of supplied $O_2$ gas: 1 slm
Irradiation time of $O_2$ gas: 18 seconds An attempt was made to form a SiOCN film having a C concentration of approximately 16 atoms % by adjusting each processing condition based on the above-described reference processing condition.

As a result, a SiOCN film having a C concentration of approximately 16 atoms % was obtained by changing a pressure in the process chamber from 133 Pa (1 Torr) to 2394 Pa (18 Torr) in the second step. In this case, it was confirmed that a SiOCN film having a C ratio higher than that of a SiOCN film formed by the reference processing conditions may be formed. That is, it was confirmed that a SiOCN film having a high C ratio may be formed by setting a pressure in the process chamber in the second step to a higher pressure than a pressure in the process chamber with respect to the reference processing conditions. It was also confirmed that as C concentration increases, N concentration decreases. The processing conditions except for the pressure in the process chamber in the second step were set to the same conditions as in the reference processing conditions. That is, the processing conditions in this case were set as follows.

<First Sequence (Change in Pressure During Supply of $C_3H_6$ Gas)>
(First Step)
Temperature in process chamber: 630° C.
Pressure in process chamber: 133 Pa (1 Torr)
Flow rate of supplied HCD gas: 0.2 slm
Irradiation time of HCD gas: 6 seconds
(Second Step)
Temperature in process chamber: 630° C.
Pressure in process chamber: 2,394 Pa (18 Torr)
Flow rate of supplied $C_3H_6$ gas: 1 slm
Irradiation time of $C_3H_6$ gas: 12 seconds
(Third Step)
Temperature in process chamber: 630° C.
Pressure in process chamber: 866 Pa (6.5 Torr)
Flow rate of supplied $NH_3$ gas: 4.5 slm
Irradiation time of $NH_3$ gas: 18 seconds
(Fourth Step)
Temperature in process chamber: 630° C.
Pressure in process chamber: 133 Pa (1 Torr)
Flow rate of supplied $O_2$ gas: 1 slm
Irradiation time of $O_2$ gas: 18 seconds It was also confirmed that, even when an irradiation time of $C_3H_6$ gas is changed from 12 seconds to 96 seconds in the second step, a SiOCN film having a C concentration of approximately 16 atoms % is obtained, which indicates that a SiOCN film having a C ratio higher than that of a SiOCN film formed by the reference processing conditions may be formed. That is, it was confirmed that, even when an irradiation time of $C_3H_6$ gas in the second step is longer than that of $C_3H_6$ gas with respect to the reference processing conditions, a SiOCN film having a high C ratio may be formed. It was also confirmed that as C concentration increases, N concentration decreases. The processing conditions other than the irradiation time of $C_3H_6$ gas in the second step were set to the same conditions as in the reference processing conditions. That is, the processing conditions in this case were set as follows.

<First Sequence (Change in Irradiation Time During Supply of $C_3H_6$ Gas)>
(First Step)
Temperature in process chamber: 630° C.
Pressure in process chamber: 133 Pa (1 Torr)
Flow rate of supplied HCD gas: 0.2 slm
Irradiation time of HCD gas: 6 seconds
(Second Step)
Temperature in process chamber: 630° C.
Pressure in process chamber: 133 Pa (1 Torr)
Flow rate of supplied $C_3H_6$ gas: 1 slm
Irradiation time of $C_3H_6$ gas: 96 seconds
(Third Step)
Temperature in process chamber: 630° C.
Pressure in process chamber: 866 Pa (6.5 Torr)
Flow rate of supplied $NH_3$ gas: 4.5 slm
Irradiation time of $NH_3$ gas: 18 seconds
(Fourth Step)
Temperature in process chamber: 630° C.
Pressure in process chamber: 133 Pa (1 Torr)
Flow rate of supplied $O_2$ gas: 1 slm
Irradiation time of $O_2$ gas: 18 seconds In this case, all the uniformities in film thickness on wafer surfaces of formed SiOCN films were less than ±1.5%, which is an excellent result. The uniformity in film thickness on the wafer surface represents a deviation degree of film thickness distribution on the wafer surface, and as the deviation degree is smaller, the uniformity in film thickness distribution on the wafer surface is excellent.

According to the embodiment of the present invention, it can be seen that a SiOCN film having an excellent uniformity in film thickness on the wafer surface may be formed. In addition, it can be seen that when a SiOCN film according to the embodiment of the present invention is used as the insulating film, a surface of the SiOCN film may be endowed with uniform performance, thereby contributing to enhanced performance of a semiconductor device or enhanced yield rate When the third step and the fourth step of the first sequence according to the above-described embodiment of the present invention were performed in a random order to form a film, a SiOCN film was not formed on the wafer. That is, it was confirmed that when film formation was performed in the order of the first step, the second step, the fourth step, and the third step, a SiOCN film could not be obtained. The processing conditions in each step are set to the same processing conditions as the processing conditions (reference processing conditions) in each step of the embodiment. Accordingly, it was revealed that even when a layer including Si and C formed in the first and second steps is oxidized and then nitrided, a SiOCN film cannot be obtained, and a layer containing Si and C formed in the first and second steps needs to be oxidized after being nitrided in order to obtain a SiOCN film.

<Preferred Aspects of the Invention>

Hereinafter, preferred aspects according to the present invention will be additionally stated.

According to one aspect to the present invention, there is provided a method of manufacturing a semiconductor device including performing a cycle a predetermined number of times to form an oxycarbonitride film having a predetermined thickness on a substrate in a process vessel, wherein the cycle includes steps of:

(a) performing a set of steps a predetermined number of times to form a carbonitride layer having a predetermined thickness on the substrate; and (b) supplying an oxygen-containing gas into the process vessel to oxidize the carbonitride layer having the predetermined thickness, thereby forming an oxycarbonitride layer, wherein the set of steps includes:

(a-1) supplying a gas containing an element into the process vessel accommodating the substrate under a condition where a CVD reaction is caused to form a layer containing the element on the substrate;

(a-2) supplying a carbon-containing gas into the process vessel to form a carbon-containing layer on the layer containing the element, thereby forming a layer including the element and a carbon; and (a-3) supplying a nitrogen-containing gas into the process vessel to nitride the layer including the element and the carbon, thereby forming the carbonitride layer.

Preferably, in the step (b), the carbonitride layer having the predetermined thickness is thermally oxidized under a condition where an oxidation reaction of the carbonitride layer having the predetermined thickness caused by the oxygen-containing gas is unsaturated.

Preferably, in the step (a-2), a discontinuous chemical adsorption layer is formed as the carbon-containing layer on the layer containing the element, in the step (a-3), the layer including the element and the carbon is thermally nitrided under a condition where a nitridation reaction of the layer including the element and the carbon caused by the nitrogen-containing gas is unsaturated, and in the step (b), the carbonitride layer having the predetermined thickness is thermally oxidized under a condition where an oxidation reaction of the carbonitride layer having the predetermined thickness caused by the oxygen-containing gas is unsaturated.

Preferably, in the step (a-1), a deposition layer of the element is formed as the layer containing the element on the substrate, in the step (a-2), a discontinuous chemical adsorption layer is formed as the carbon-containing layer on the layer containing the element, in the step (a-3), the layer including the element and the carbon is thermally nitrided under a condition where a nitridation reaction of the layer including the element and the carbon caused by the nitrogen-containing gas is unsaturated, and in the step (b), the carbonitride layer having the predetermined thickness is thermally oxidized under a condition where an oxidation reaction of the carbonitride layer having the predetermined thickness caused by the oxygen-containing gas is unsaturated.

Preferably, a composition of the oxycarbonitride film is adjusted by controlling a pressure in the process vessel, or the pressure and a gas supply time in at least one of the steps.

Preferably, at least one of concentrations of the element, the carbon, a nitrogen and an oxygen in the oxycarbonitride film is adjusted by controlling a pressure in the process vessel, or the pressure and a gas supply time in at least one of the steps.

Preferably, the element includes a semiconductor element or a metal element.

Preferably, the element is a silicon.

According to another aspect to the present invention, there is provided a method of manufacturing a semiconductor device including performing a cycle a predetermined number of times to form a silicon oxycarbonitride film having a predetermined thickness on a substrate in a process vessel, wherein the cycle includes steps of:

(a) performing a set of steps a predetermined number of times to form a silicon carbonitride layer having a predetermined thickness on the substrate; and (b) supplying an oxygen-containing gas into the process vessel to oxidize the silicon carbonitride layer having the predetermined thickness, thereby forming a silicon oxycarbonitride layer, wherein the set of steps includes:

(a-1) supplying a silicon-containing gas into the process vessel accommodating the substrate under a condition where a CVD reaction is caused to form a silicon-containing layer on the substrate;

(a-2) supplying a carbon-containing gas into the process vessel to form a carbon-containing layer on the silicon-containing layer, thereby forming a layer including a silicon and a carbon; and (a-3) supplying a nitrogen-containing gas into the process vessel to nitride the layer including the silicon and the carbon, thereby forming the silicon carbonitride layer.

Preferably, in the step (b), the silicon carbonitride layer having the predetermined thickness is thermally oxidized under a condition where an oxidation reaction of the silicon carbonitride layer having the predetermined thickness caused by the oxygen-containing gas is unsaturated.

Preferably, in the step (a-2), a discontinuous chemical adsorption layer is formed as the carbon-containing layer on the silicon-containing layer, in the step (a-3), the layer including the silicon and the carbon is thermally nitrided under a condition where a nitridation reaction of the layer including the silicon and the carbon caused by the nitrogen-containing gas is unsaturated, and in the step (b), the silicon carbonitride layer having the predetermined thickness is thermally oxidized under a condition where an oxidation reaction of the silicon carbonitride layer having the predetermined thickness caused by the oxygen-containing gas is unsaturated.

Preferably, in the step (a-1), a deposition layer of the silicon is formed as the silicon-containing layer on the substrate, in the step (a-2), a discontinuous chemical adsorption layer is formed as the carbon-containing layer on the silicon-containing layer, in the step (a-3), the layer including the silicon and the carbon is thermally nitrided under a condition where a nitridation reaction of the layer including the silicon and the carbon caused by the nitrogen-containing gas is unsaturated, and in the step (b), the silicon carbonitride layer having the predetermined thickness is thermally oxidized under a condition where an oxidation reaction of the silicon carbonitride layer having the predetermined thickness caused by the oxygen-containing gas is unsaturated.

Preferably, a composition of the silicon oxycarbonitride film is adjusted by controlling a pressure in the process vessel, or the pressure and a gas supply time in at least one of the steps.

Preferably, at least one of concentrations of the silicon, the carbon, a nitrogen and an oxygen in the silicon oxycarbonitride film is adjusted by controlling a pressure in the process vessel, or the pressure and a gas supply time in at least one of the steps.

According to still another aspect of the present invention, there is provided a method of manufacturing a semiconductor device including performing a cycle a predetermined number of times to form an oxycarbonitride film having a predetermined thickness on a substrate in a process vessel, wherein the cycle includes steps of:

(a) supplying a gas containing an element into the process vessel accommodating the substrate under a condition where a CVD reaction is caused to form a layer containing the element on the substrate;

(b) supplying a carbon-containing gas into the process vessel to form a carbon-containing layer on the layer containing the element, thereby forming a layer including the element and a carbon;

(c) supplying a nitrogen-containing gas into the process vessel to nitride the layer including the element and the carbon, thereby forming a carbonitride layer; and (d) supplying an oxygen-containing gas into the process vessel to oxidize the carbonitride layer having the predetermined thickness, thereby forming an oxycarbonitride layer.

According to yet another aspect of the present invention, there is provided a method of manufacturing a semiconductor device including performing a cycle a predetermined number of times to form a silicon oxycarbonitride film having a predetermined thickness on a substrate in a process vessel, wherein the cycle includes steps of:

(a) supplying a silicon-containing gas into the process vessel accommodating the substrate under a condition where a CVD reaction is caused to form a silicon-containing layer on the substrate;

(b) supplying a carbon-containing gas into the process vessel to form a carbon-containing layer on the silicon-containing layer, thereby forming a layer including the silicon and a carbon;

(c) supplying a nitrogen-containing gas into the process vessel to nitride the layer including the silicon and the carbon, thereby forming a silicon carbonitride layer; and (d) supplying an oxygen-containing gas into the process vessel to oxidize the silicon carbonitride layer having the predetermined thickness, thereby forming a silicon oxycarbonitride layer.

According to yet another aspect of the present invention, there is provided a method of processing a substrate including performing a cycle a predetermined number of times to form an oxycarbonitride film having a predetermined thickness on a substrate in a process vessel, wherein the cycle includes steps of:

(a) performing a set of steps a predetermined number of times to form a carbonitride layer having a predetermined thickness on the substrate: and (b) supplying an oxygen-containing gas into the process vessel to oxidize the carbonitride layer having the predetermined thickness, thereby forming an oxycarbonitride layer, wherein the set of steps includes:

(a-1) supplying a gas containing an element into the process vessel accommodating the substrate under a condition where a CVD reaction is caused to form a layer containing the element on the substrate;

(a-2) supplying a carbon-containing gas into the process vessel to form a carbon-containing layer on the layer containing the element, thereby forming a layer including the element and a carbon; and (a-3) supplying a nitrogen-containing gas into the process vessel to nitride the layer including the element and the carbon, thereby forming the carbonitride layer.

According to yet another aspect of the present invention, there is provided a substrate processing apparatus including:

a process vessel configured to accommodate a substrate;

a heater configured to heat the substrate in the process vessel;

an element-containing gas supply system configured to supply a gas containing an element into the process vessel;

a carbon-containing gas supply system configured to supply a carbon-containing gas into the process vessel;

a nitrogen-containing gas supply system configured to supply a nitrogen-containing gas into the process vessel;

an oxygen-containing gas supply system configured to supply an oxygen-containing gas into the process vessel;

a pressure regulating unit configured to regulate a pressure in the process vessel; and a control unit configured to control the heater, the element-containing gas supply system, the carbon-containing gas supply system, the nitrogen-containing gas supply system, the oxygen-containing gas supply system and the pressure regulating unit such that an oxycarbonitride film having a predetermined thickness is formed on the substrate by performing a cycle a predetermined number of times wherein the cycle includes processes of: (a) performing a set of processes a predetermined number of times to form a carbonitride layer having a predetermined thickness on the substrate; and (b) supplying an oxygen-containing gas into the process vessel to oxidize the carbonitride layer having the predetermined thickness, thereby forming an oxycarbonitride layer, wherein the set of processes includes: (a-1) supplying a gas containing an element into the process vessel accommodating the substrate under a condition where a CVD reaction is caused to form a layer containing the element on the substrate; (a-2) supplying a carbon-containing gas into the process vessel to form a carbon-containing layer on the layer containing the element, thereby forming a layer including the element and a carbon; and (a-3) supplying a nitrogen-containing gas into the process vessel to nitride the layer including the element and the carbon, thereby forming the carbonitride layer.

According to yet another aspect of the present invention, there is provided a method of manufacturing a semiconductor device including performing a cycle a predetermined number of times to form an oxycarbonitride film having a predetermined thickness on a substrate in a process vessel, wherein the cycle includes steps of:

(a) performing a set of steps a predetermined number of times to form a carbonitride layer having a predetermined thickness on the substrate; and (b) supplying an oxygen-containing gas into the process vessel to oxidize the carbonitride layer having the predetermined thickness, thereby forming an oxycarbonitride layer, wherein the set of steps includes:

(a-1) supplying a gas containing an element into the process vessel accommodating the substrate under a condition where a CVD reaction is caused to form a layer containing the element on the substrate;

(a-2) supplying a carbon-containing gas into the process vessel to form a carbon-containing layer on the layer containing the element, thereby forming a first layer including the element and a carbon;

(a-3) supplying the gas containing the element into the process vessel under a condition where a CVD reaction is caused to form a layer containing the element on the first layer including the element and the carbon, thereby forming a second layer containing the element and the carbon; and (a-4) supplying a nitrogen-containing gas into the process vessel to nitride the second layer including the element and the carbon, thereby forming the carbonitride layer.

According to yet another aspect of the present invention, there is provided a method of manufacturing a semiconductor device including performing a cycle a predetermined number of times to form an oxycarbonitride film having a predetermined thickness on a substrate in a process vessel, wherein the cycle includes steps of:

(a) supplying a gas containing an element into the process vessel accommodating the substrate under a condition where a CVD reaction is caused to form a layer containing the element on the substrate;

(b) supplying a carbon-containing gas into the process vessel to form a carbon-containing layer on the layer containing the element, thereby forming a first layer including the element and a carbon;

(c) supplying the gas containing the element into the process vessel under a condition where a CVD reaction is caused to form a layer containing the element on the first layer including the element and the carbon, thereby forming a second layer containing the element and the carbon;

(d) supplying a nitrogen-containing gas into the process vessel to nitride the second layer including the element and the carbon, thereby forming the carbonitride layer; and (e) supplying an oxygen-containing gas into the process vessel to oxidize the carbonitride layer having the predetermined thickness, thereby forming an oxycarbonitride layer.

According to yet another aspect of the present invention, there is provided a substrate processing apparatus including:

a process vessel configured to accommodate a substrate;

a heater configured to heat the substrate in the process vessel;

an element-containing gas supply system configured to supply a gas containing an element into the process vessel;

a carbon-containing gas supply system configured to supply a carbon-containing gas into the process vessel;

a nitrogen-containing gas supply system configured to supply a nitrogen-containing gas into the process vessel;

an oxygen-containing gas supply system configured to supply an oxygen-containing gas into the process vessel;

a pressure regulating unit configured to regulate a pressure in the process vessel; and a control unit configured to control the heater, the element-containing gas supply system, the carbon-containing gas supply system, the nitrogen-containing gas supply system, the oxygen-containing gas supply system and the pressure regulating unit such that an oxycarbonitride film having a predetermined thickness is formed on the substrate by performing a cycle a predetermined number of times wherein the cycle includes processes of: (a) performing a set of processes a predetermined number of times to form a carbonitride layer having a predetermined thickness on the substrate; and (b) supplying an oxygen-containing gas into the process vessel to oxidize the carbonitride layer having the predetermined thickness, thereby forming an oxycarbonitride layer, wherein the set of processes includes: (a-1) supplying a gas containing an element into the process vessel accommodating the substrate under a condition where a CVD reaction is caused to form a layer containing the element on the substrate; (a-2) supplying a carbon-containing gas into the process vessel to form a carbon-containing layer on the layer containing the element, thereby forming a first layer including the element and a carbon; (a-3) supplying the gas containing the element into the process vessel under a condition where a CVD reaction is caused to form a layer containing the element on the first layer including the element and the carbon, thereby forming a second layer containing the element and the carbon; and (a-4) supplying a nitrogen-containing gas into the process vessel to nitride the second layer including the element and the carbon, thereby forming the carbonitride layer.

What is claimed is:

1. A method of manufacturing a semiconductor device, the method comprising forming an oxycarbonitride film on a substrate by performing a cycle a predetermined number of times, the cycle including:

(a) performing a set a predetermined number of times, the set including: (a-1) supplying a gas containing an element to the substrate; (a-2) supplying a carbon-containing gas to the substrate; and (a-3) supplying a nitrogen-containing gas to the substrate; and (b) supplying an oxygen-containing gas to the substrate, wherein the steps (a-1) through (a-3) are non-simultaneously performed, and the steps (a) and (b) are non-simultaneously performed.

2. The method of claim 1, wherein the step (a-1) comprises supplying the gas containing the element to form a layer containing the element having a thickness ranging from less than one atomic layer to several atomic layers.

3. The method of claim 1, wherein the step (a-1) comprises supplying the gas containing the element to form a continuous layer containing the element, a discontinuous layer containing the element or a layer formed by overlaying the continuous layer and the discontinuous layer.

4. The method of claim 1, wherein the step (a-1) comprises supplying the gas containing the element to form a deposition layer by deposition of the element, and the deposition layer comprises a continuous deposition layer containing the element, a discontinuous deposition layer containing the element or a layer formed by overlaying the continuous deposition layer and the discontinuous deposition layer.

5. The method of claim 1, wherein the step (a-1) comprises supplying the gas containing the element to form a continuous chemical adsorption layer of the gas containing the element or a discontinuous chemical adsorption layer of the gas containing the element.

6. The method of claim 1, wherein the step (a-2) comprises supplying the carbon-containing gas to form a discontinuous chemical adsorption layer of the carbon-containing gas.

7. The method of claim 1, wherein the step (a-3) comprises supplying the nitrogen-containing gas to thermally nitride a layer formed on the substrate under a condition where a nitridation reaction of the layer by the nitrogen-containing gas is unsaturated.

8. The method of claim 1, wherein the step (b) comprises supplying the oxygen-containing gas to thermally oxidize a layer formed on the substrate under a condition where an oxidation reaction of the layer by the oxygen-containing gas is unsaturated.

9. The method of claim 1, wherein each of the steps (a-1), (a-2), (a-3) and (b) is performed under non-plasma condition.

10. The method of claim 1, wherein each of the steps (a-1), (a-2), (a-3) and (b) comprises supplying respective gas in thermally activated state.

11. The method of claim 1, wherein each of the steps (a-1), (a-2), (a-3) and (b) is performed with the substrate accommodated in a process vessel, and a composition of the oxycarbonitride film is adjusted by controlling an inner pressure of the process vessel, or by controlling the inner pressure and a gas supply time in at least one of the steps (a), (b), (c) and (d).

12. The method of claim 1, wherein each of the steps (a-1), (a-2), (a-3) and (b) is performed with the substrate accommodated in a process vessel, and concentration of at least one of the element, carbon, nitrogen and oxygen in the oxycarbonitride film is adjusted by controlling an inner pressure of the process vessel, or by controlling the inner pressure and a gas supply time in at least one of the steps (a-1), (a-2), (a-3) and (b).

13. The method of claim 1, wherein the element includes a semiconductor element or a metal element.

14. The method of claim 1, wherein the element includes silicon.

15. A method of processing a substrate, the method comprising forming an oxycarbonitride film on a substrate by performing a cycle a predetermined number of times, the cycle including:

(a) performing a set a predetermined number of times, the set including: (a-1) supplying a gas containing an element to the substrate; (a-2) supplying a carbon-containing gas to the substrate; and (a-3) supplying a nitrogen-containing gas to the substrate; and (b) supplying an oxygen-containing gas to the substrate, wherein the steps (a-1) through (a-3) are non-simultaneously performed, and the steps (a) and (b) are non-simultaneously performed.

16. The method of claim 1, wherein the steps (a-1) through (a-3) and (b) are performed separately.

17. The method of claim 1, wherein the steps (a-1) through (a-3) and (b) are performed without mixing the gas containing the element, the carbon-containing gas, the nitrogen-containing gas and the oxygen-containing gas with one another.

18. The method of claim 1, wherein the steps (a-1) through (a-3) and (b) are performed separately by performing gas substitution processes between the steps (a-1) and (a-2), the steps (a-2) and (a-3), the steps (a-3) and (b) and the steps (b) and (a-1).

19. A method of manufacturing a semiconductor device, the method comprising forming an oxycarbonitride film on a substrate by performing a cycle a predetermined number of times, the cycle including:
 (a) performing a set a predetermined number of times, the set including: (a-1) supplying a gas containing an element to the substrate; (a-2) supplying a carbon-containing gas to the substrate; (a-3) supplying the gas containing the element to the substrate; and (a-4) supplying a nitrogen-containing gas to the substrate; and
 (b) supplying an oxygen-containing gas to the substrate,
 wherein the steps (a-1) through (a-4) are non-simultaneously performed in order, and the steps (a) and (b) are non-simultaneously performed.

* * * * *